(12) United States Patent
Watanabe et al.

(10) Patent No.: US 10,126,616 B2
(45) Date of Patent: Nov. 13, 2018

(54) ELECTRONIC DEVICE

(71) Applicant: Japan Display Inc., Tokyo (JP)

(72) Inventors: Yoshihiro Watanabe, Tokyo (JP); Yoshikatsu Imazeki, Tokyo (JP); Yoichi Kamijo, Tokyo (JP); Shuichi Osawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/662,899

(22) Filed: Jul. 28, 2017

(65) Prior Publication Data

US 2018/0031934 A1    Feb. 1, 2018

(30) Foreign Application Priority Data

Jul. 29, 2016    (JP) ................ 2016-149607

(51) Int. Cl.
| | |
|---|---|
| *H01L 27/32* | (2006.01) |
| *G02F 1/1362* | (2006.01) |
| *B32B 7/12* | (2006.01) |
| *H01L 21/02* | (2006.01) |
| *H01L 21/28* | (2006.01) |
| *H01L 21/50* | (2006.01) |
| *G02F 1/1339* | (2006.01) |
| *H01L 21/60* | (2006.01) |
| *G02F 1/1333* | (2006.01) |

(52) U.S. Cl.
CPC .......... *G02F 1/136227* (2013.01); *B32B 7/12* (2013.01); *G02F 1/1339* (2013.01); *G02F 1/136213* (2013.01); *H01L 21/02063* (2013.01); *H01L 21/28273* (2013.01); *H01L 21/50* (2013.01); *G02F 2001/133388* (2013.01); *H01L 2021/60075* (2013.01)

(58) Field of Classification Search
CPC .................................................. H01L 2924/181
See application file for complete search history.

(56) References Cited

U.S. PATENT DOCUMENTS

| | | | |
|---|---|---|---|
| 2007/0122960 A1* | 5/2007 | Aoki | H01L 23/49822 438/197 |
| 2015/0049278 A1* | 2/2015 | Shibata | G02F 1/13454 349/46 |
| 2015/0060807 A1* | 3/2015 | Koshihara | H01L 27/322 257/40 |
| 2018/0006060 A1* | 1/2018 | Kjmura | G02F 1/133707 |

FOREIGN PATENT DOCUMENTS

JP    2002-40465 A    2/2002

* cited by examiner

*Primary Examiner* — Thao P Le
(74) *Attorney, Agent, or Firm* — K&L Gates LLP

(57) ABSTRACT

According to one embodiment, an electronic device includes a first substrate including a first basement and a first conductive layer, a second substrate including a second basement opposed to the first basement and the first conductive layer, and a second conductive layer, a sealing material located between the first substrate and the second substrate to bond the first substrate to the second substrate, a contact hole penetrating the second basement, the sealing material and the first conductive layer, and a connecting material electrically connecting the first conductive layer with the second conductive layer via the contact hole.

18 Claims, 15 Drawing Sheets

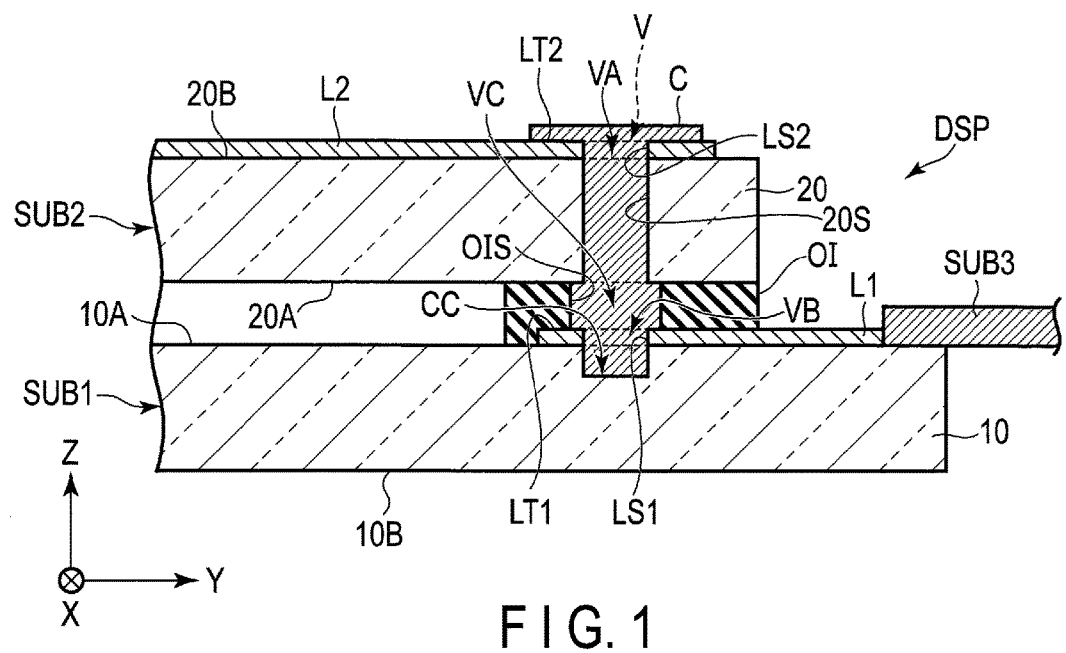
F I G. 1
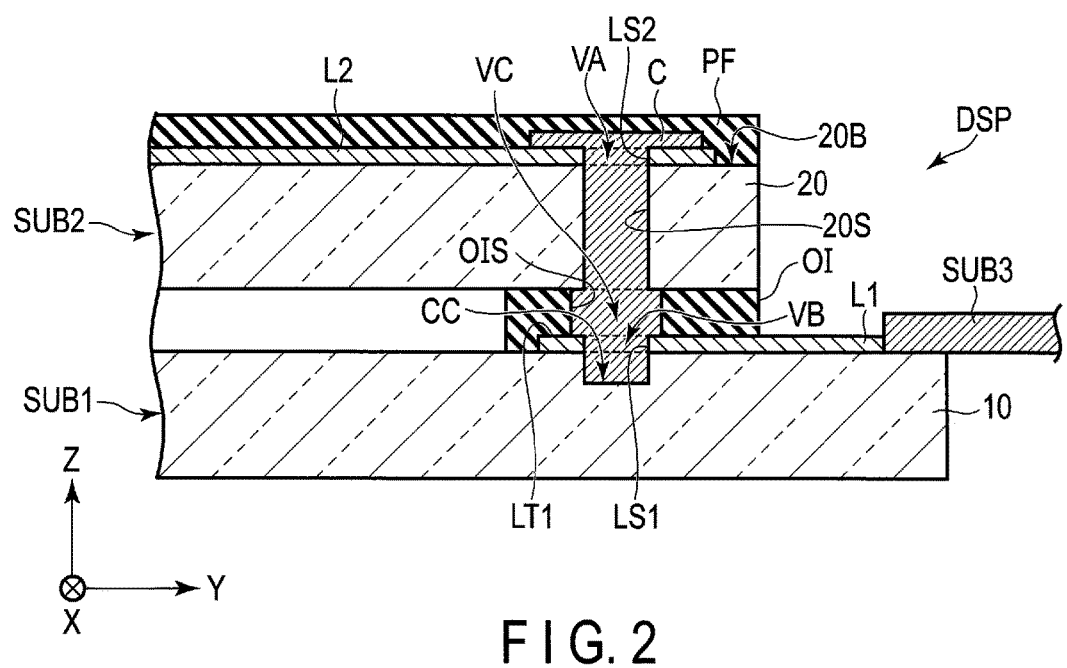
F I G. 2

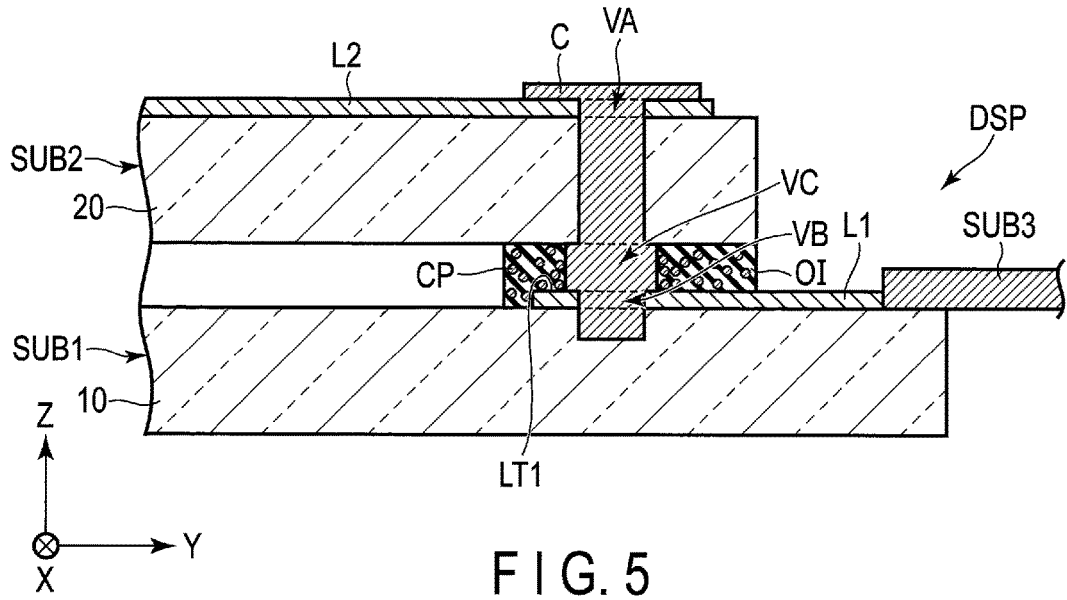
F I G. 5
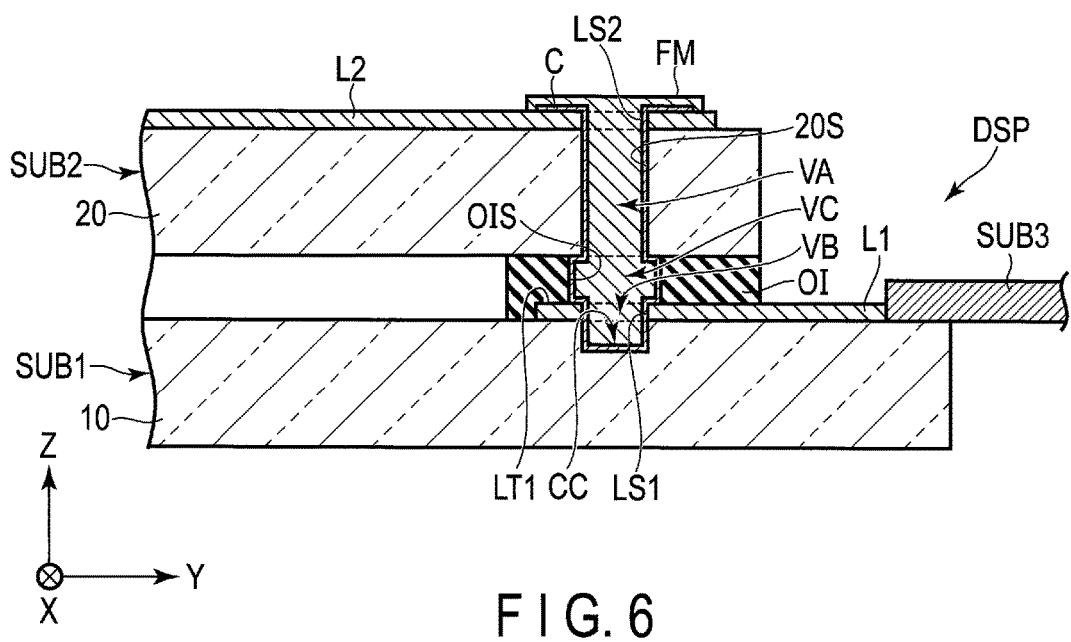
F I G. 6

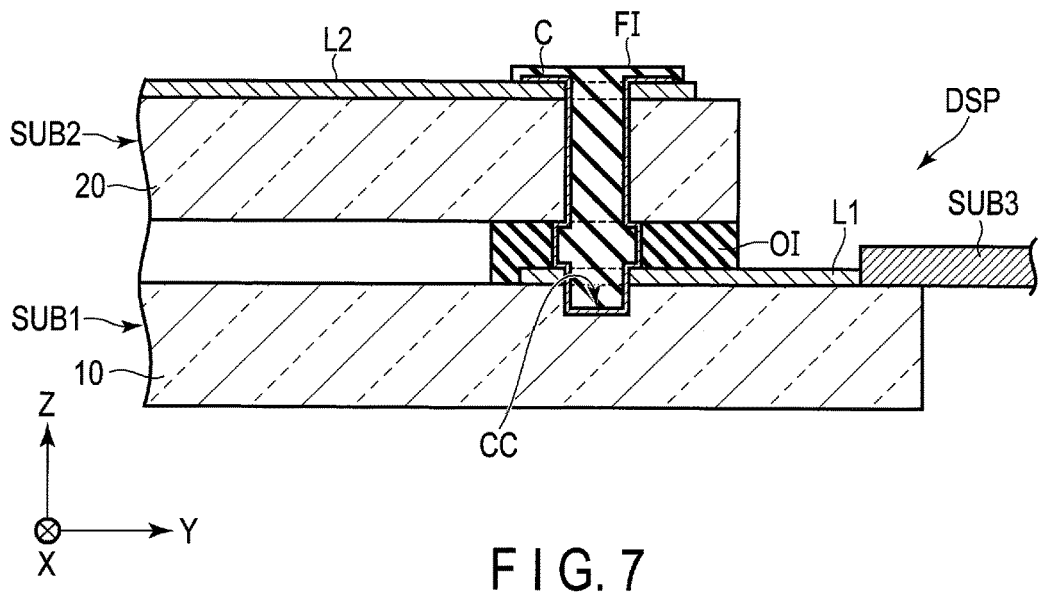
F I G. 7
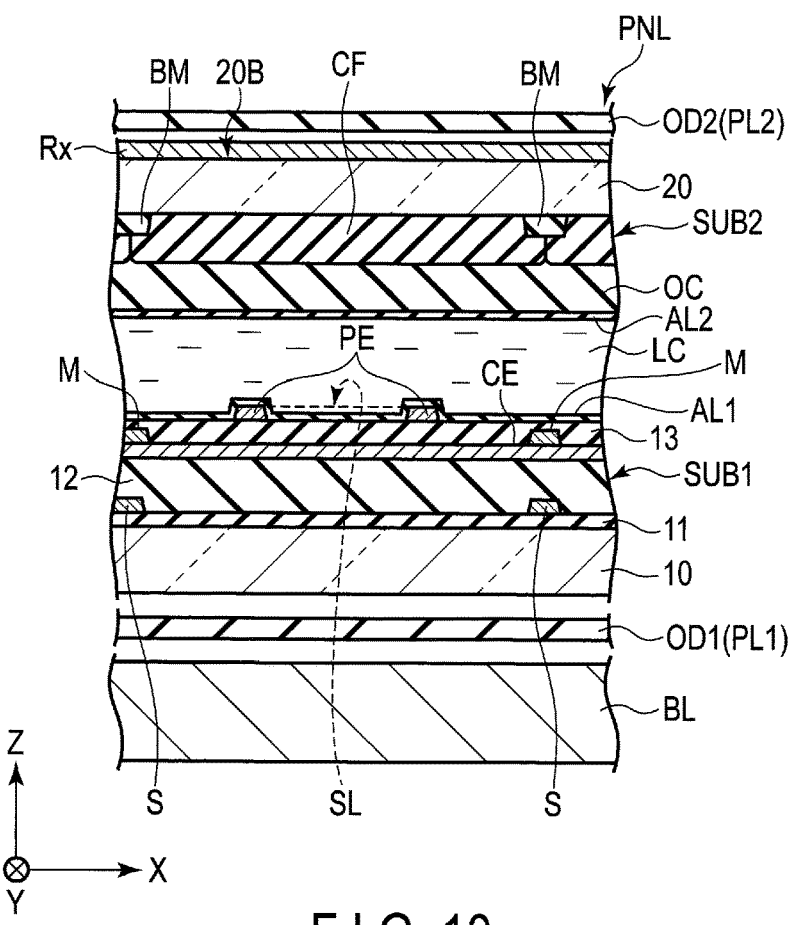
F I G. 10

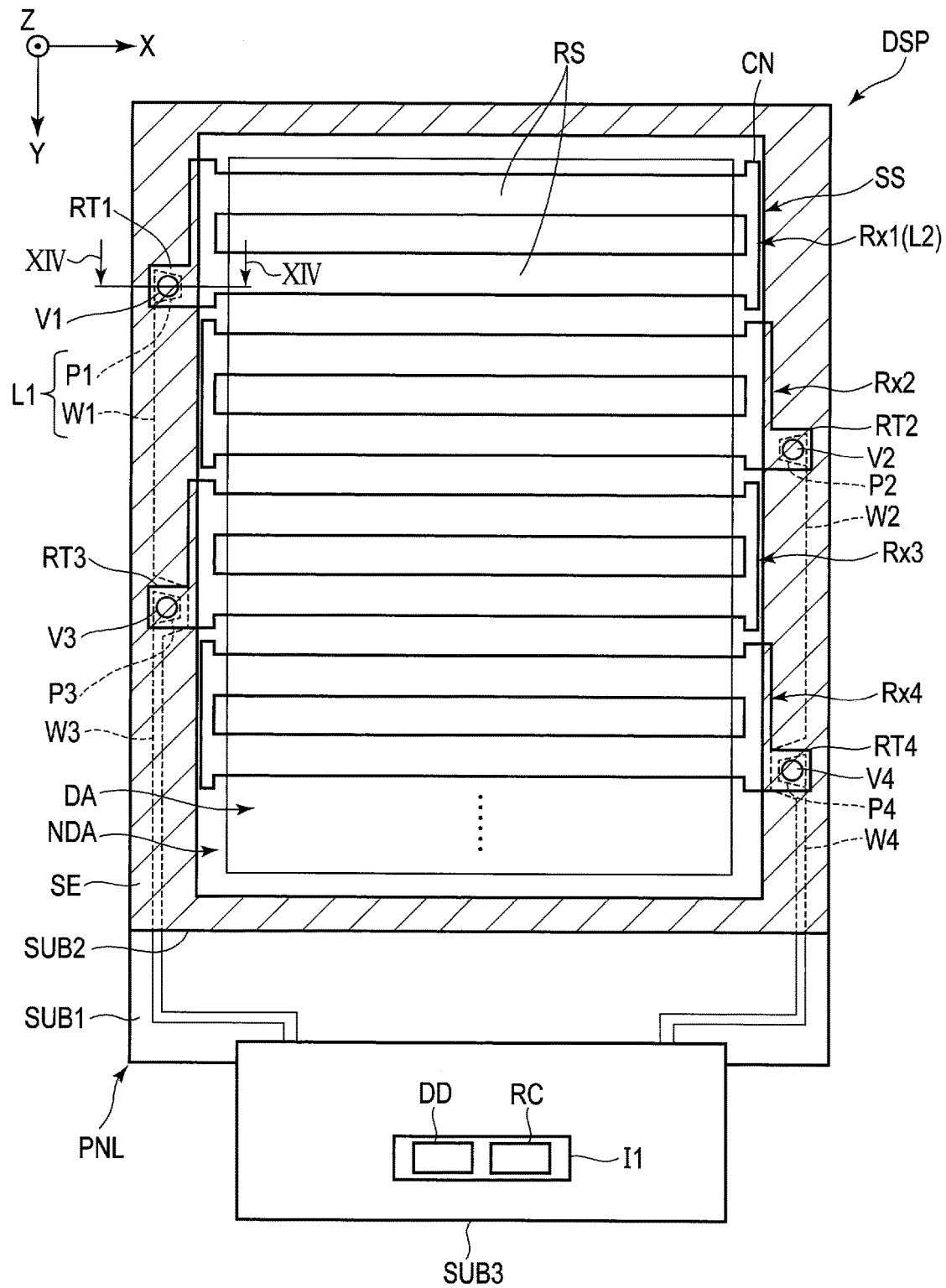
F I G. 8

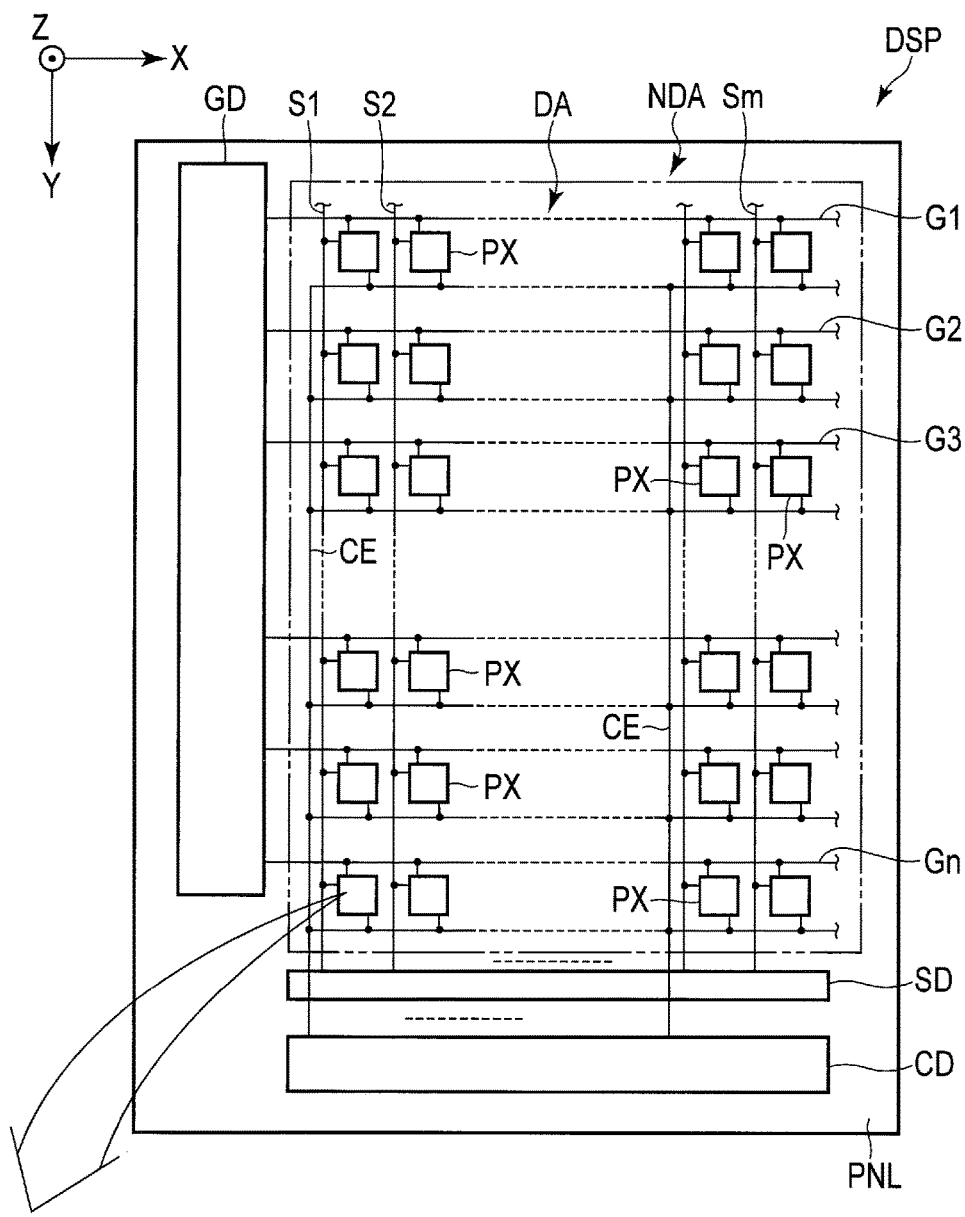
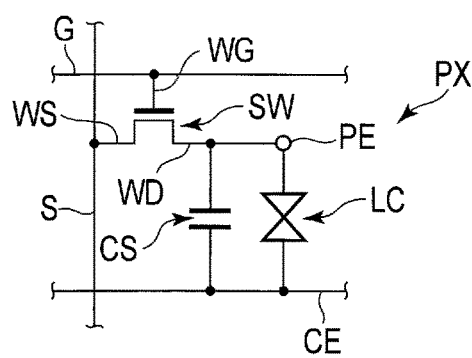
F I G. 9

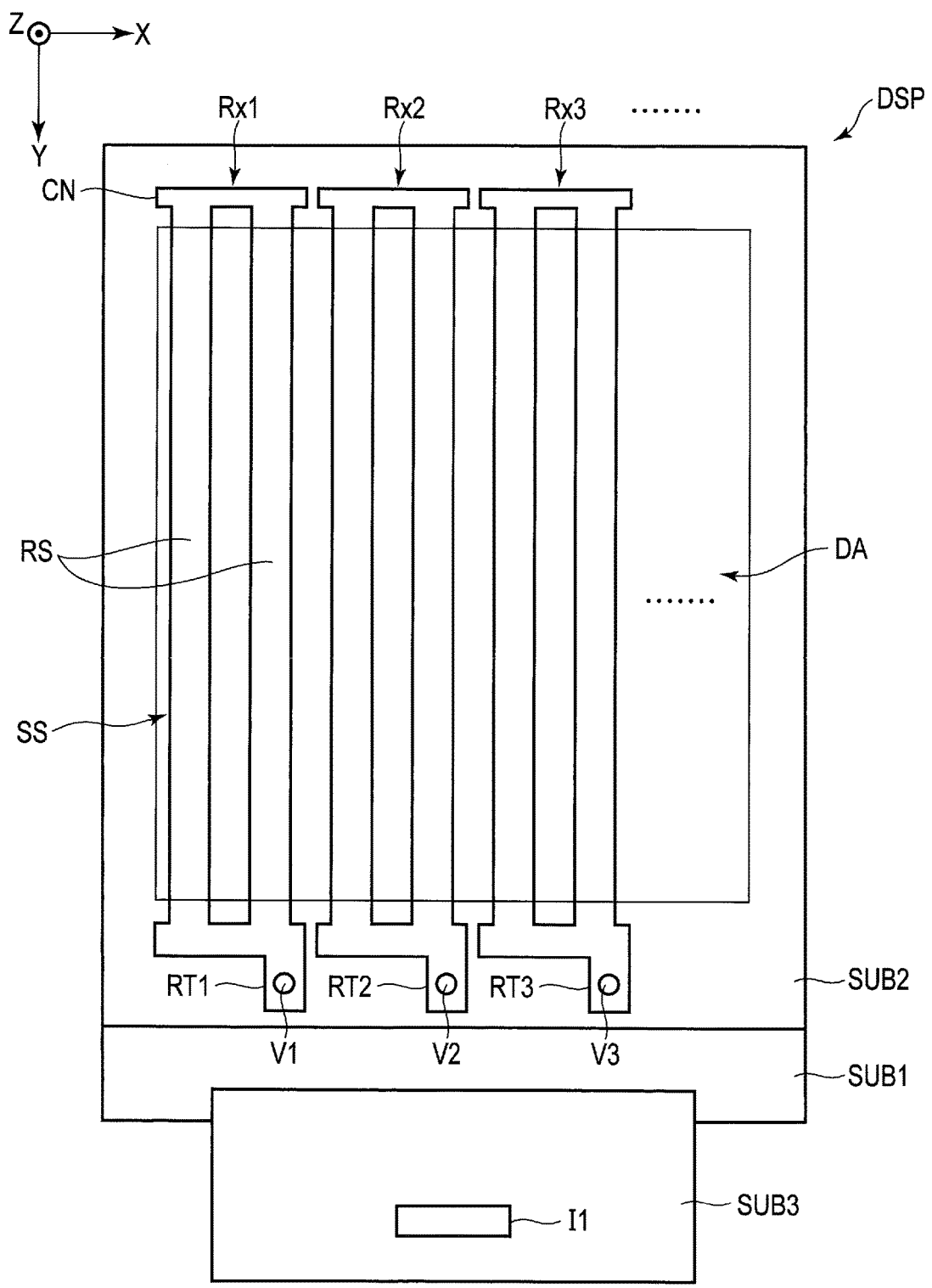
F I G. 12

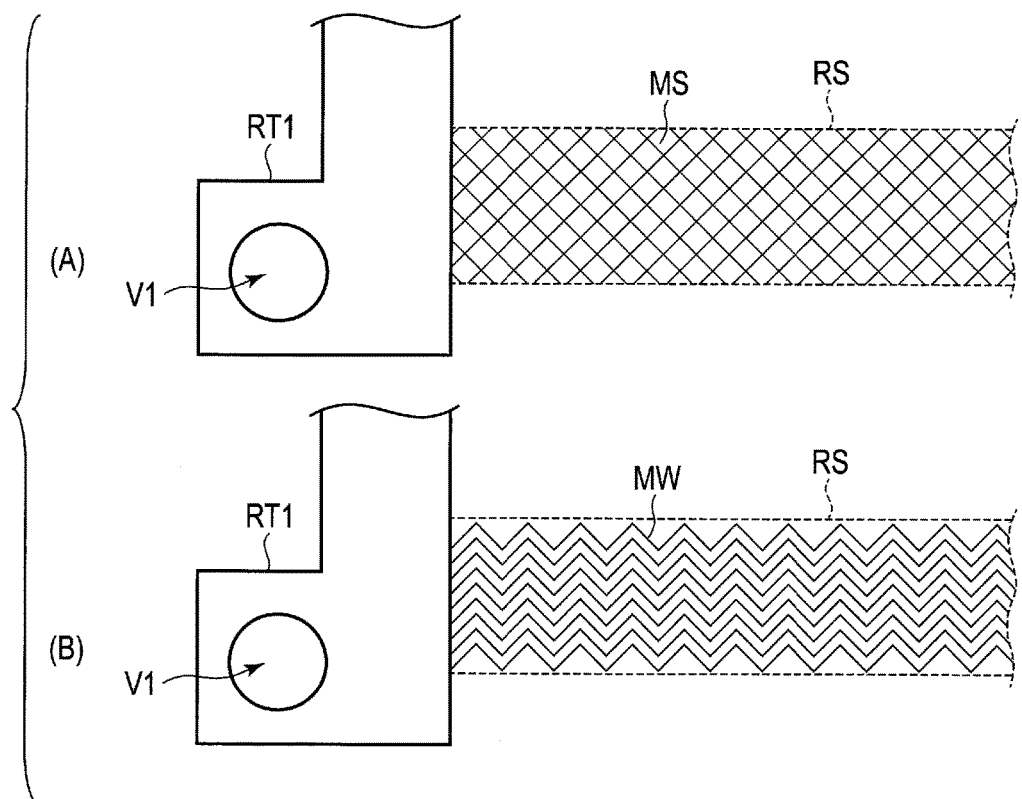
F I G. 13
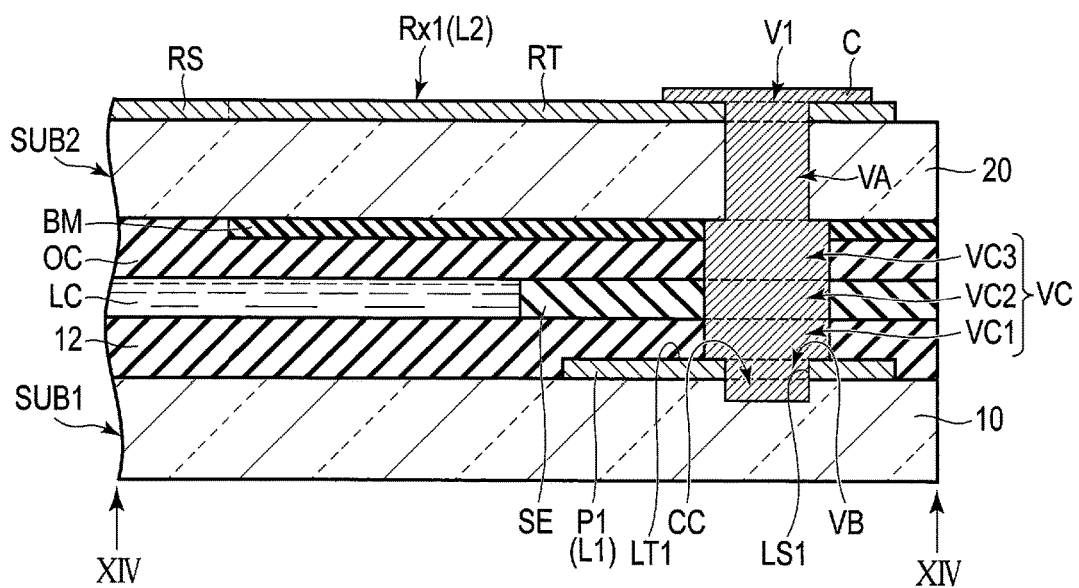
F I G. 14

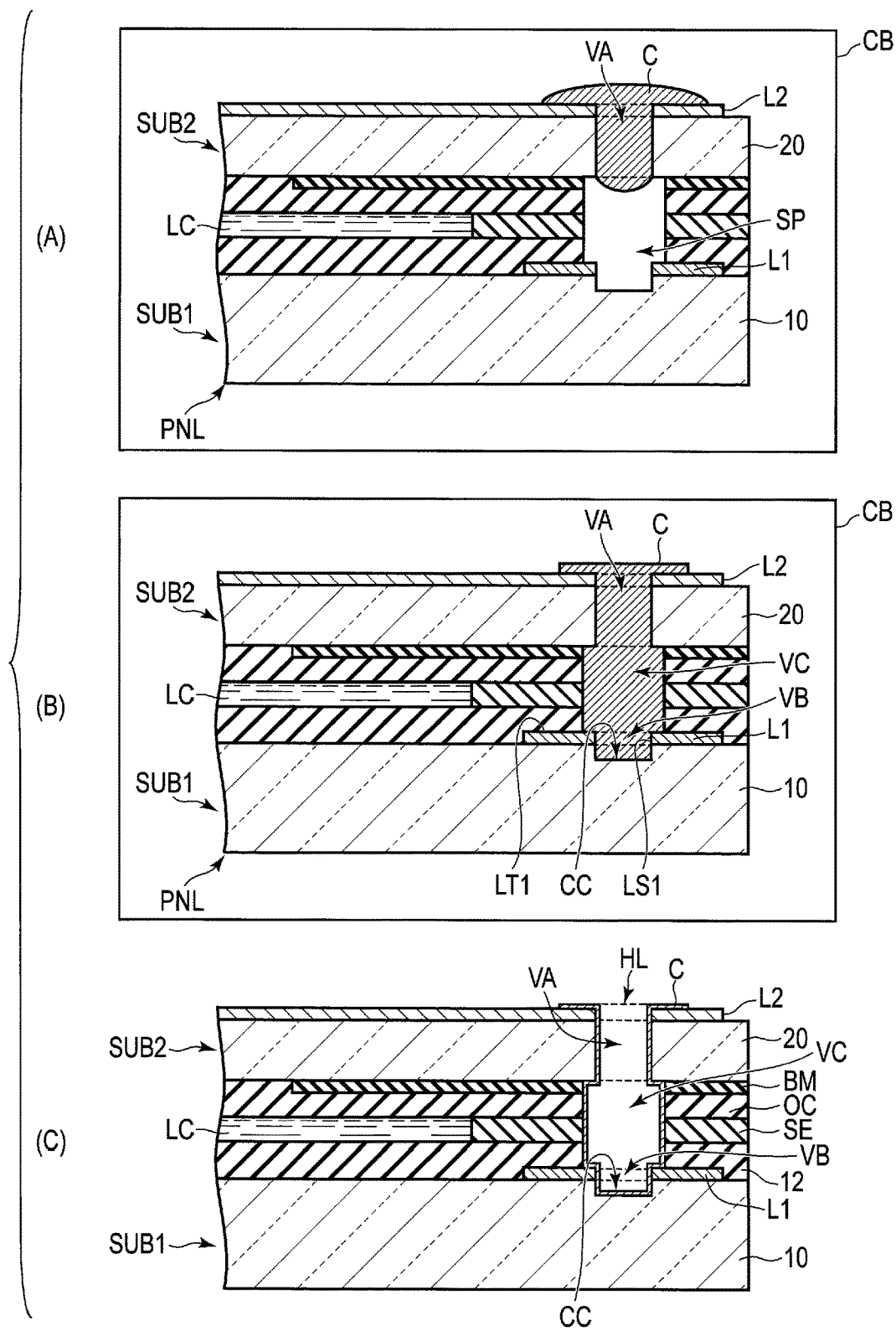
F I G. 16

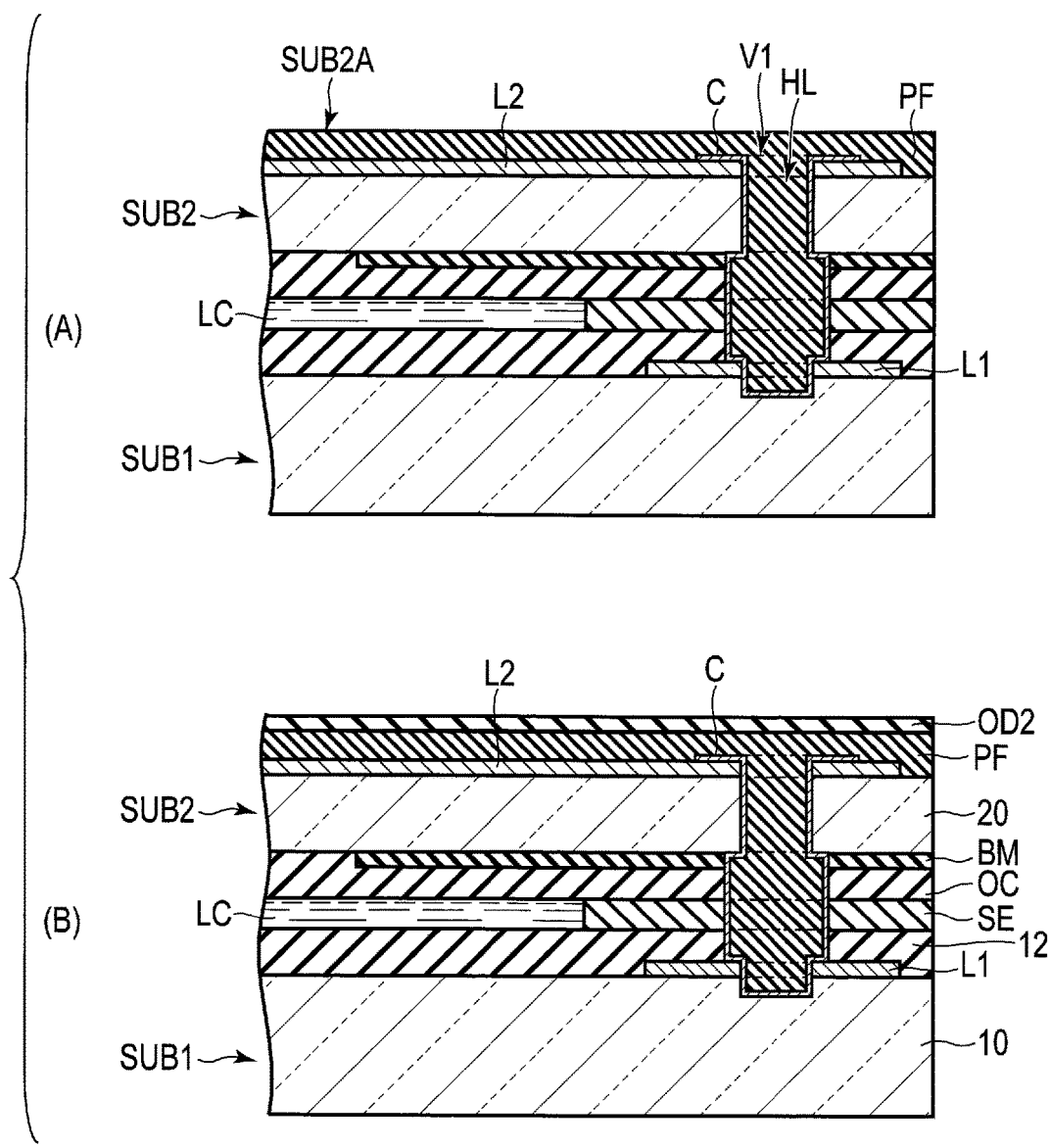
F I G. 17

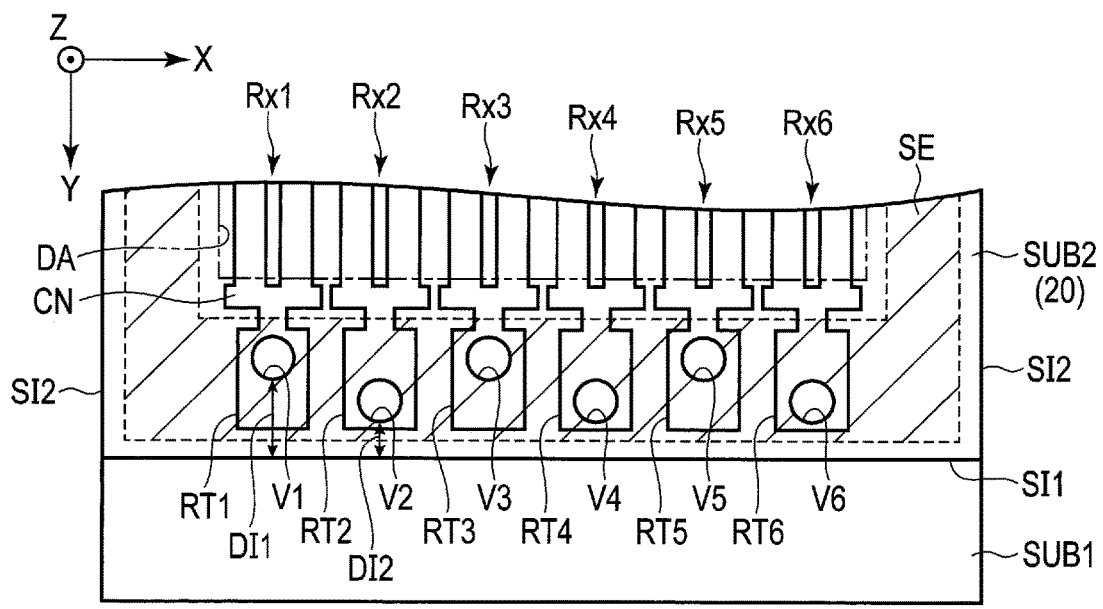
F I G. 19
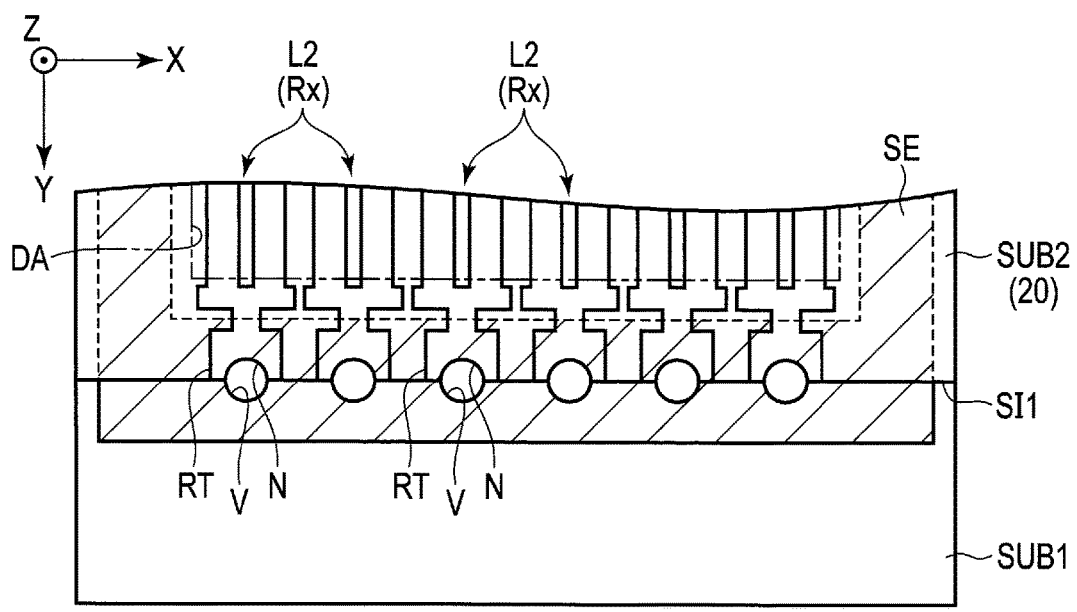
F I G. 20

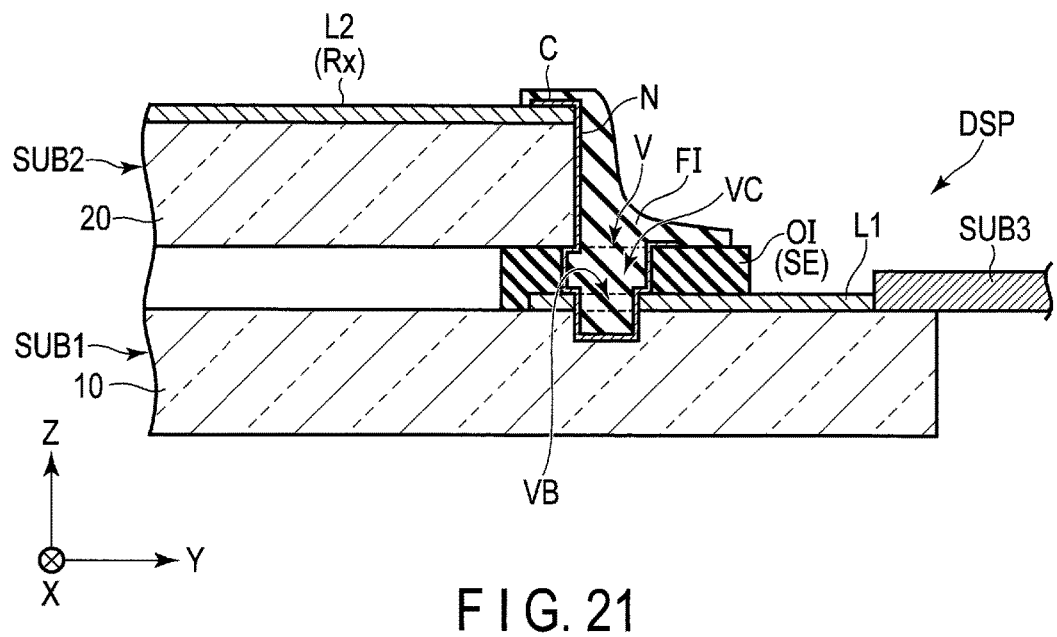
F I G. 21
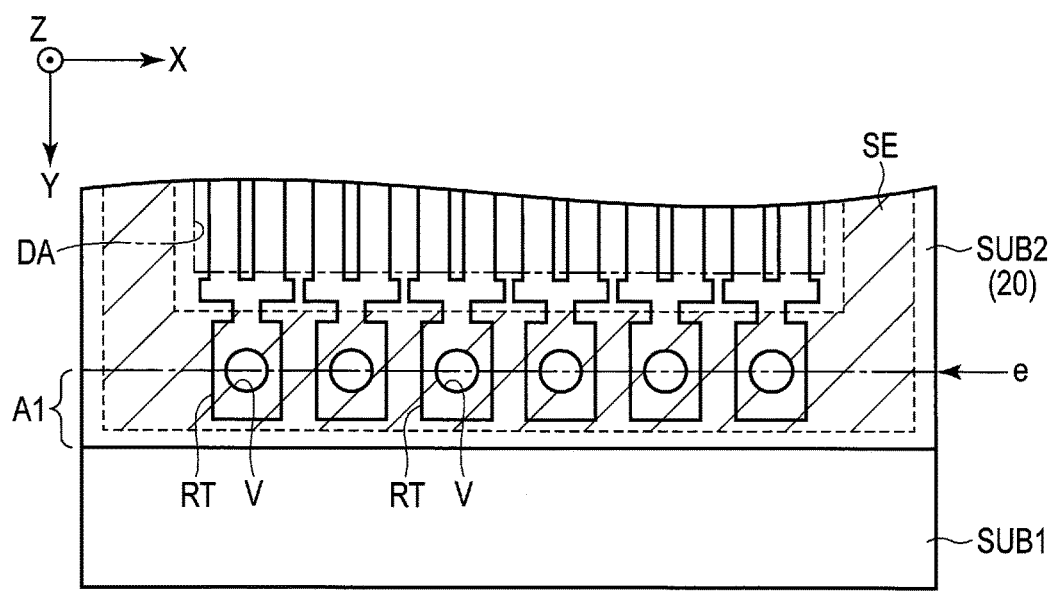
F I G. 22

ELECTRONIC DEVICE

CROSS-REFERENCE TO RELATED APPLICATIONS

This application is based upon and claims the benefit of priority from Japanese Patent Application No. 2016-149607, filed Jul. 29, 2016, the entire contents of which are incorporated herein by reference.

FIELD

Embodiments described herein relate generally to an electronic device.

BACKGROUND

Recently, various technologies of forming a display device in a narrower frame shape have been reviewed. For example, a technology of electrically connecting wiring having an in-hole connector inside a hole which penetrates an inner surface and an outer surface of a first substrate formed of resin with wiring provided on an inner surface of a second substrate formed of resin, by another connector, has been disclosed.

SUMMARY

The present disclosure relates generally to an electronic device.

In an embodiment, an electronic device is provided. The electronic device includes a first substrate including a first basement and a first conductive layer; a second substrate including a second basement opposed to the first basement and the first conductive layer, and a second conductive layer; a sealing material located between the first substrate and the second substrate to bond the first substrate to the second substrate; a contact hole penetrating the second basement, the sealing material and the first conductive layer; and a connecting material electrically connecting the first conductive layer with the second conductive layer via the contact hole.

In another embodiment, an electronic device is provided. The electronic device includes a first substrate including a first basement and a first conductive layer; a second substrate including a second basement opposed to the first basement and the first conductive layer, and a plurality of second conductive layers; a sealing material located between the first substrate and the second substrate to bond the first substrate to the second substrate; a plurality of contact holes penetrating the second basement and the sealing material; and a connecting material electrically connecting the first conductive layer with the second conductive layer via at least one of the contact holes, wherein positions of the contact holes are not aligned in a direction in which the second conductive layers are arranged.

Additional features and advantages are described herein, and will be apparent from the following Detailed Description and the figures.

BRIEF DESCRIPTION OF THE DRAWINGS

FIG. 1 is a cross-sectional view showing a configuration example of a display device of an embodiment.

FIG. 2 is a cross-sectional view showing another configuration example of the display device of the embodiment.

FIG. 5 is a cross-sectional view showing yet another configuration example of the display device of the embodiment.

FIG. 6 is a cross-sectional view showing yet another configuration example of the display device of the embodiment.

FIG. 7 is a cross-sectional view showing yet another configuration example of the display device of the embodiment.

FIG. 8 is a plan view showing a configuration example of the display device of the embodiment.

FIG. 9 is a diagram showing a basic configuration and an equivalent circuit, of the display panel shown in FIG. 8.

FIG. 10 is a cross-sectional view showing a partial configuration of the display panel shown in FIG. 8.

FIG. 12 is a plan view showing another configuration example of the display device of the embodiment.

FIG. 13 is an illustration showing a configuration example of a detector in a detection electrode shown in FIG. 8 and FIG. 12.

FIG. 14 is a cross-sectional view showing the display panel including a contact hole shown in FIG. 8 as sectioned in line XIV-XIV.

FIG. 16 is a cross-sectional view for explanation of a method of manufacturing the display device of the embodiment.

FIG. 17 is a cross-sectional view for explanation of a method of manufacturing the display device of the embodiment.

FIG. 19 is a plan view showing a configuration example of a part of the display device according to modified example 2 of the embodiment.

FIG. 20 is a plan view showing a configuration example of a part of the display device according to modified example 3 of the embodiment.

FIG. 21 is a cross-sectional view showing a configuration example of a part of the display device according to modified example 3.

FIG. 22 is a diagram for explanation of a method of manufacturing the display device according to modified example 3.

DETAILED DESCRIPTION

Figure 3:
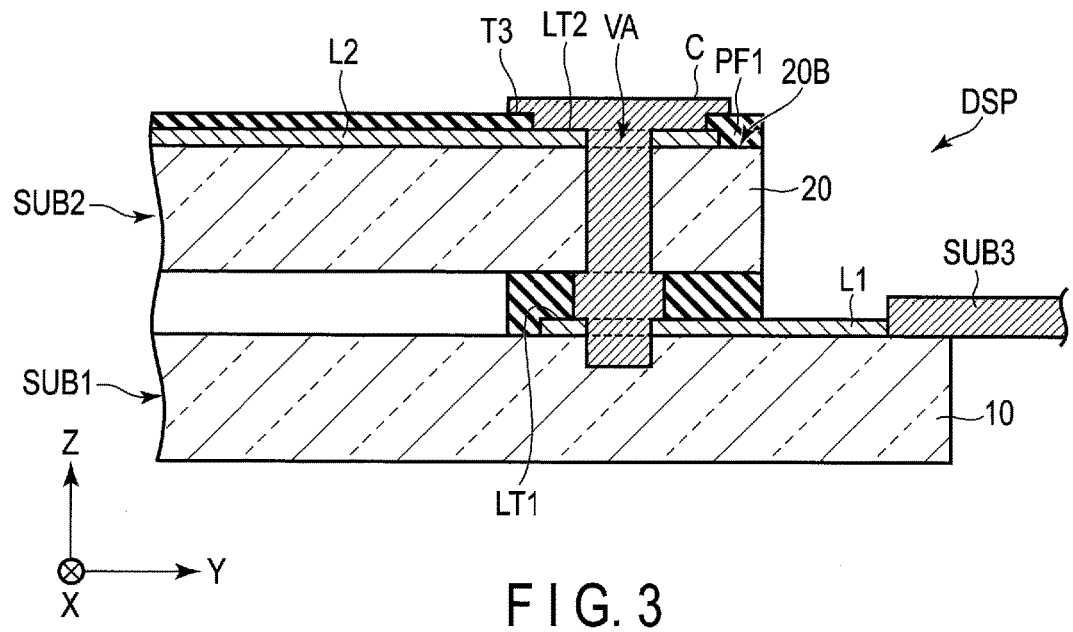
FIG. 3 is a cross-sectional view showing yet another configuration example of the display device of the embodiment.

In general, according to one embodiment, there is provided an electronic device, comprising: a first substrate including a first basement and a first conductive layer; a second substrate including a second basement opposed to the first basement and the first conductive layer, and a second conductive layer; a sealing material located between the first substrate and the second substrate to bond the first substrate to the second substrate; a contact hole penetrating the second basement, the sealing material and the first conductive layer; and a connecting material electrically connecting the first conductive layer with the second conductive layer via the contact hole.

According to another embodiment, there is provided an electronic device, comprising: a first substrate including a first basement and a first conductive layer; a second substrate including a second basement opposed to the first basement and the first conductive layer, and a plurality of second conductive layers; a sealing material located between the first substrate and the second substrate to bond the first substrate to the second substrate; a plurality of contact holes penetrating the second basement and the sealing material; and a connecting material electrically connecting the first conductive layer with the second conductive layer via at least one of the contact holes, wherein positions of the contact holes are not aligned in a direction in which the second conductive layers are arranged.

According to yet another embodiment, there is provided an electronic device, comprising: a first substrate including a first basement and a first conductive layer; a second substrate including a second basement opposed to the first basement and the first conductive layer, and a second conductive layer; a sealing material located between the first substrate and the second substrate to bond the first substrate to the second substrate; a second hole penetrating the first conductive layer; a third hole connected to the second hole to penetrate the sealing material; a notch opposed to the second hole and the third hole and formed on one of edges of the second basement; and a connecting material electrically connecting the first conductive layer with the second conductive layer via the second hole, the third hole, and the notch.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

In the embodiments, a display device is disclosed as an example of the electronic device. This display device can be used in various devices such as smartphones, tablet terminals, mobile phones, notebook computers, and game consoles. The major configuration explained in the embodiments can be applied to a liquid crystal display device, a self-luminous display device such as an organic electroluminescent display device, an electronic paper display device comprising an electrophoretic element and the like, a display device employing micro-electro-mechanical systems (MEMS), or a display device employing electrochromism.

FIG. 1 is a cross-sectional view showing a configuration example of a display device DSP of the embodiment.

As shown in FIG. 1, the first direction X, the second direction Y and the third direction Z are orthogonal to each other, but may intersect at an angle other than ninety degrees. The first direction X and the second direction Y correspond to directions parallel to surfaces of substrates constituting the display device DSP, and the third direction Z corresponds to a thickness direction of the display device DSP. The figure shows the cross-section of a part of the display device DSP in a Y-Z plane defined by the second direction Y and the third direction Z.

The display device DSP comprises a first substrate SUB1, a second substrate SUB2, a connecting material C, and a wiring substrate SUB3. The first substrate SUB1 and the second substrate SUB2 are opposed to each other in the third direction Z. In the following explanations, a direction from the first substrate SUB1 to the second substrate SUB2 is called an upward direction (or, more simply, upwardly) and a direction from the second substrate SUB2 to the first substrate SUB1 is called a downward direction (or, more simply, downwardly). A view from the second substrate SUB2 to the first substrate SUB1 is called a planar view.

The first substrate SUB1 includes a first basement 10, and a first conductive layer L1 located on a side of the first basement 10 opposed to the second substrate SUB2. The first basement 10 has a surface 10A opposed to the second substrate SUB2, and a surface 10B on a side opposite to the surface 10A. In the example illustrated, the first conductive layer L1 is located on the surface 10A. Various insulating layers or various conductive layers may be disposed between the first basement 10 and the first conductive layer L1 or on the first conductive layer L1, which is not illustrated in the drawing.

The second substrate SUB2 includes a second basement 20 and a second conductive layer L2. The second basement 20 has a surface 20A opposed to the first substrate SUB1, and a surface 20B on a side opposite to the surface 20A. The surface 20A of the second basement 20 is opposed to the first conductive layer L1 and remote from the first conductive layer L1 in the third direction Z. In the example illustrated, the second conductive layer L2 is located on the surface 20B. The first basement 10, the first conductive layer L1, the second basement 20 and the second conductive layer L2 are arranged in this order in the third direction Z. An organic insulating layer OI is located between the first conductive layer L1 and the second basement 20.

The organic insulating layer OI includes at least a sealing material that bonds the first substrate SUB1 to the second substrate SUB2. The organic insulating layer OI includes, for example, a light-shielding layer, a color filter, an overcoat layer, an alignment film and the like that are to be explained later, other than the sealing material. Various insulating layers or various conductive layers may be disposed between the second basement 20 and the second conductive layer L2 or on the second conductive layer L2, which is not illustrated in the drawing. Various insulating layers or various conductive layers may also be disposed between the first substrate SUB1 and the second substrate SUB2.

The first basement 10 and the second basement 20 are formed of, for example, glass and, more specifically, alkali-free glass. Alternatively, the first basement 10 and the second basement 20 may be resin substrates formed of resin. The first conductive layer L1 and the second conductive layer L2 are formed of for example, metallic materials such as molybdenum, tungsten, titanium, aluminum, silver, copper and chromium, an alloy of a combination of these metallic materials, transparent conductive materials such as indium tin oxide (ITO) and indium zinc oxide (IZO) and the like, and may be formed in a single-layer structure or a multilayer structure. The connecting material C desirably contains a metallic material such as silver and also contains fine particles having the size of order of several nanometers to several tens of nanometers.

The wiring substrate SUB3 is mounted on the first substrate SUB1 and electrically connected with the first conductive layer L1. The wiring substrate SUB3 is, for example, a flexible substrate having flexibility. The flexible substrate applicable to the present embodiment may comprise a flexible part formed of a flexible material on at least a part of the substrate. For example, the wiring substrate SUB3 of the present embodiment may be a flexible substrate entirely configured as a flexible part or a rigid-flexible substrate comprising a rigid part formed of a hard material such as glass epoxy and a flexible part formed of a flexible material such as polyimide.

A connecting structure of the first conductive layer L1 and the second conductive layer L2 of the embodiments will be explained in detail. In the second substrate SUB2, the second basement 20 includes a hole (first hole) VA penetrating between the surfaces 20A and 20B. In the example illustrated, the hole VA also penetrates the second conductive layer L2. In contrast, in the first substrate SUB1, the first conductive layer L1 includes a hole (second hole) VB opposed to the hole VA in the third direction Z. In addition, the first basement 10 includes a concavity CC opposed to the hole VB in the third direction Z.

The organic insulating layer OI includes a hole (third hole) VC communicating with the holes VA and VB. In the example illustrated, the hole VC is expanded in the second direction Y as compared with the holes VA and VB. The hole VC is more expanded than the holes VA and VB not only in the second direction Y, but in all direction in the X-Y plane. The concavity CC, the hole VB, the hole VC and the hole VA are arranged in this order in the third direction Z.

The concavity CC is formed from the surface 10A to the surface 10B, but does not penetrate to reach the surface 10B in the example illustrated. For example, a depth of the concavity CC in the third direction Z is approximately one fifth to approximately a half of the thickness of the first basement 10 in the third direction Z. The first basement 10 may include a hole penetrating between the surfaces 10A and 10B instead of the concavity CC. The hole VB and the concavity CC are located directly under the holes VA and VC. The holes VA, VC and VB, and the concavity CC are located in the same straight line along the third direction Z to form a contact hole V.

The connecting material C electrically connects the first conductive layer L1 with the second conductive layer L2 via the holes VA, VB and VC. In the example illustrated, the connecting material C is in contact with each of an upper surface LT2 of the second conductive layer L2, an inner surface LS2 of the second conductive layer L2 in the hole VA, and an inner surface 20S of the second basement 20 in the hole VA, in the second substrate SUB2. The inner surfaces LS2 and 20S urge the hole VA to appear.

In addition, the connecting material C is in contact with each of an inner surface LS1 of the first conductive layer L1 in the hole VB, an upper surface LT1 of the first conductive layer L1 and the concavity CC, in the first substrate SUB1. The inner surface LS1 urges the hole VB to appear.

The connecting material C is in contact with an inner surface OIS of the organic insulating layer OI in the hole VC. The inner surface OIS urges the hole VC to appear. In the example illustrated, the holes VA, VB and VC and the concavity CC are filled with the connecting material C so as to be buried but the connecting material C may be provided on at least the inner surfaces of the holes and the concavity.

The connecting material C is formed sequentially between the first conductive layer L1 and the second conductive layer L2.

The second conductive layer L2 is thereby electrically connected with the wiring substrate SUB3 via the connecting material C and the first conductive layer L1. For this reason, the control circuit configured to write a signal to the second conductive layer L2 and read a signal output from the second conductive layer L2 can be connected to the second conductive layer L2 via the wiring substrate SUB3. In other words, a wiring substrate other than the wiring substrate SUB3 does not need to be mounted on the second substrate SUB2.

According to the embodiments, a terminal to mount the other wiring substrate and a routing line to connect the second conductive layer L2 with the other wiring substrate are unnecessary. For this reason, the substrate size of the second substrate SUB2 can be reduced and the width (frame width) of the periphery of the display device DSP can be reduced in the X-Y plane defined by the first direction X and the second direction Y. In addition, manufacturing costs of the other wiring substrate considered unnecessary can be reduced. The display device can be thereby designed in a narrower frame shape and its manufacturing costs can be reduced.

The contact holes V remove a part of the organic insulating layer OI (sealing material) to expose the first conductive layer L1. Even if the contact holes V are filled with the conductive material used for the connecting material C, the conductive material is blocked by the organic insulating layer OI. Even if the conductive material has low viscosity, a situation in which the conductive material undesirably spreads in the X-Y plane between the first substrate SUB1 and the second substrate SUB2 can be avoided. For example, occurrence of a short circuit can be thereby avoided.

In addition, since the connecting material C is in contact with not only the inner surface LS1 of the first conductive layer L1 in the hole VB but also the upper surface LT1 of the first conductive layer L1, a contact area of the connecting material C on the first conductive layer L1 can be increased and connection failure between the connecting material C and the first conductive layer L1 can be suppressed.

Next, other configuration examples of the present embodiment will be explained with reference to FIG. 2 to FIG. 7.

The configuration example shown in FIG. 2 is different from the configuration example shown in FIG. 1 with respect to a feature that the second substrate SUB2 comprises a protection material PF which covers the second conductive layer L2 and the connecting material C. In the example illustrated, the protection material PF also covers the second surface 20B of the second basement 20. If the connecting material C is provided on the inner surfaces of the inner surfaces LS1, OIS, 20S and LS2 and the concavity CC and the vicinities of central portions of the holes VA, VB and VC are not filled with the connecting material C, the connecting material C includes a hollow. In this case, the hollow of the connecting material C may be filled with the protection material PF. The protection material PF is formed of, for example, an organic insulating material such as an acrylic resin. In this configuration example, too, not only the same advantages as those explained above can be obtained, but the second conductive layer L2 and the connecting material C can be protected.

The configuration example shown in FIG. 3 is different from the configuration example shown in FIG. 1 with respect to a feature that the second substrate SUB2 comprises a protection material PF1 which covers the second conductive layer L2. In the example illustrated, the second conductive layer L2 and the surface 20B of the second basement 20 are covered with the protection material PF1, but the surrounding of the hole VA of the second conductive layer L2 is not covered with the protection material PF1. The connecting material C is in contact with the upper surface LT2 of the second conductive layer L1 in the surrounding of the hole VA and further with an upper surface T3 of the protection material PF1 in its surrounding. In this configuration example, too, not only the same advantages as those explained above can be obtained, but the second conductive layer L2 can be protected.

Figure 4:
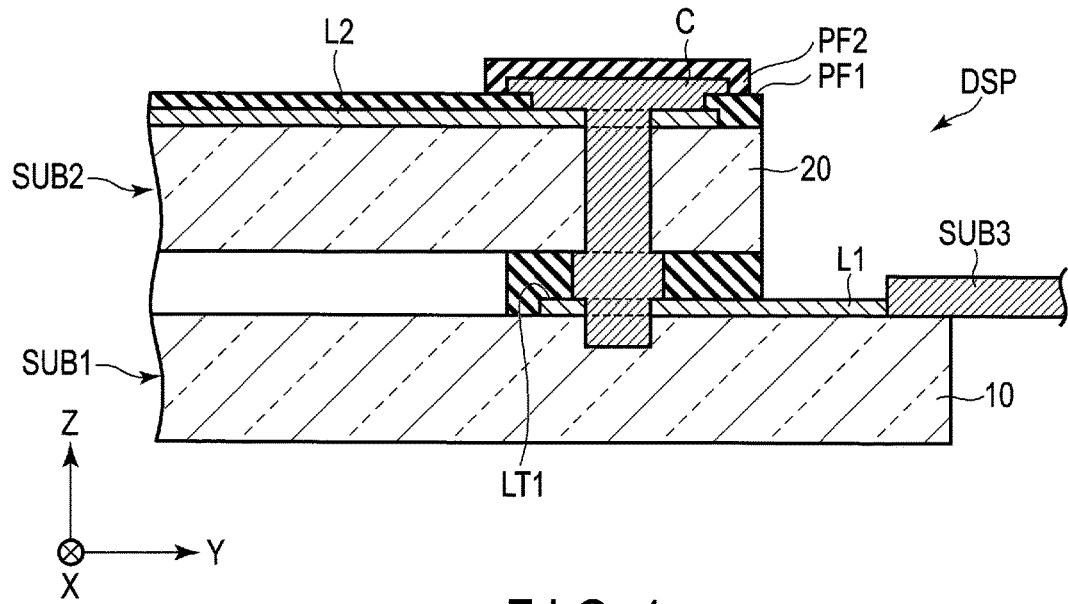
FIG. 4 is a cross-sectional view showing yet another configuration example of the display device of the embodiment.

The configuration example shown in FIG. 4 is different from the configuration example shown in FIG. 3 with respect to a feature that the second substrate SUB2 comprises a protection material PF2 which covers the connecting material C. In the example illustrated, the protection material PF2 is in contact with the protection material PF1 in the surrounding of the connecting material C. If the connecting material C includes the hollow, the hollow may be filled with the protection material PF2. In addition, the protection material PF2 may be disposed to cover not only the surrounding of the connecting material C, but also the protection material PF1. In this configuration example, too, not only the same advantages as those explained above can be obtained, but the second conductive layer L2 and the connecting material C can be protected.

The configuration example shown in FIG. 5 is different from the configuration example in FIG. 1 with respect to a feature that the organic insulating layer OI contains conductive particles CP. In this configuration example, too, the same advantages as those explained above can be obtained. In addition, even if the connecting material C is interrupted in the hole VC due to the conductive particles CP in contact with the connecting material C located in the hole VC, the interrupted connecting material C can be made conductive by the conductive particles CP and the reliability can be increased.

The configuration example shown in FIG. 6 is different from the configuration example in FIG. 1 with respect to a feature that the connecting material C is provided on the inner surfaces LS1, OIS, 20S and LS2 and the inner surface of the concavity CC and the hollow of the connecting material C is filled with the conductive filling material FM. The filling material FM is obtained by curing, for example, paste containing conductive particles of silver or the like. In this configuration example, too, the same advantages as those explained above can be obtained. In addition, even if the connecting material C is interrupted, the filling material FM can electrically connect the first conductive layer L1 with the second conductive layer L2 and the reliability can be increased. The step in the third direction Z caused by forming the hollow in the connecting material C can be reduced.

The configuration example shown in FIG. 7 is different from the configuration example in FIG. 6 with respect to a feature that the hollow of the connecting material C is filled with an insulating filling material FI. The filling material FI is formed of, for example, an organic insulating material. In this configuration example, too, not only the same advantages as those explained above can be obtained, but the connecting material C can be protected.

FIG. 8 is a plan view showing a configuration example of the display device DSP of the embodiment. A liquid crystal display device equipped with a sensor SS will be explained here as an example of the display device DSP.

The display device DSP comprises a display panel PNL, an IC chip I1, the wiring substrate SUB3 and the like. The display panel PNL is a liquid crystal display panel, which includes a first substrate SUB1, a second substrate SUB2, a sealing material SE and a display function layer (a liquid crystal layer LC to be explained later). The second substrate SUB2 is opposed to the first substrate SUB1. The sealing material SE corresponds to a portion represented by upward sloping hatch lines in FIG. 8 to bond the first substrate SUB1 to the second substrate SUB2.

The display panel PNL includes a display area DA on which an image is displayed and a frame-shaped non-display area NDA surrounding the display area DA. The display area DA corresponds to, for example, a first area and located on an inner side surrounded by the sealing material SE. The non-display area NDA corresponds to, for example, a second area adjacent to the display area (first area) DA. The sealing material SE is located in the non-display area NDA.

The IC chip I1 is mounted on the wiring substrate SUB3. The IC chip I1 is not limited to the example illustrated, but may be mounted on the first substrate SUB1 extending to an outer side than the second substrate SUB2 or an external circuit substrate connected to the wiring substrate SUB3. The IC chip I1 incorporates, for example, a display driver DD which outputs a signal necessary to display an image. The display driver DD includes at least some of a signal line drive circuit SD, a scanning line drive circuit and a common electrode drive circuit CD which will be explained later. In the example illustrated, the IC chip I1 incorporates a detection circuit RC which functions as a touch panel controller or the like. The detection circuit RC may be incorporated in the other IC chip different from the IC chip I1.

The display panel PNL may be, for example, a transmissive display panel having a transmissive display function of displaying an image by urging the light from the lower side of the first substrate SUB1 to be selectively transmitted, a reflective display panel having a reflective display function of displaying an image by urging the light from the upper side of the second substrate SUB2 to be selectively reflected, or a transreflective display panel having the transmissive display function and the reflective display function.

The sensor SS executes sensing to detect contact with or approach to the liquid crystal display device DSP, of an object. The sensor SE comprises a plurality of detection electrodes Rx (Rx1, Rx2, ... ). The detection electrodes Rx are provided on the second substrate SUB2 and correspond to the above-explained second conductive layer L2. The detection electrodes Rx extend in the first direction X and are arranged to be spaced apart in the second direction Y. In FIG. 8, detection electrodes Rx1 to Rx4 are illustrated as the detection electrodes Rx, and an example of the structure of the detection electrode Rx1 will be specifically explained here.

The detection electrode Rx1 comprises detectors RS, a terminal RT1 and a connector CN.

The detectors RS are located in the display area DA and extend in the first direction X. In the detection electrode Rx1, the detectors RS are primarily used for sensing. In the example illustrated, each detector RS is formed in a strip shape and, more specifically, formed of an assembly of fine metal wires as explained with reference to FIG. 13. One detection electrode Rx1 comprises two detectors RS but may comprise three or more detectors RS or one detector RS.

The terminal RT1 is located on one end side of the non-display area NDA in the first direction X to communicate with the detectors RS. The connector CN is located on the other end side of the non-display area NDA in the first direction X to connect the detectors RS with each other. In FIG. 8, the one end side corresponds to the left side of the display area DA and the other end side corresponds to the right side of the display area DA. A part of the terminal RT1 is formed at a position overlaid on the sealing material SE in planar view.

In contrast, the first substrate SUB1 includes a pad P1 and a wiring line W1 corresponding to the first conductive layer L1. The pad P1 and a wiring line W1 are located on one end side of the non-display area NDA and overlaid on the sealing material SE in planar view. The pad P1 is formed at a position overlaid on the terminal RT1 in planar view. The wiring line W1 is connected to the pad P1 to extend in the second direction Y, and is electrically connected with the detection circuit RC of the IC chip I1 via the wiring substrate SUB3.

A contact hole V1 is formed at a position at which the terminal RT1 is opposed to the pad P1. In addition, the contact hole V1 may penetrate the sealing material SE and the second substrate SUB2 including the terminal RT1 and may also penetrate the pad P1. In the example illustrated, the contact hole V1 is formed in a circular shape in planar view, the shape is not limited to the example illustrated but may be the other shapes such as an elliptic shape. As explained with reference to FIG. 1 and the like, the connecting material C is provided in the contact hole V1. The terminal RT1 is thereby electrically connected to the pad P1. In other words, the detection electrode Rx1 provided on the second substrate SUB2 is electrically connected with the detection circuit RC via the wiring substrate SUB3 connected to the first substrate SUB1. The detection circuit RC reads the sensor signal output from the detection electrode Rx and detects contact or approach of the object, position coordinates of the object and the like.

In the example illustrated, the terminals RT1, RT3, . . . , of the odd-numbered detection electrodes Rx1, Rx3, . . . , the pads P1, P3, . . . , the wiring lines W1, W3, . . . , and the contact holes V1, V3, . . . are located on one end side of the non-display area NDA. In addition, the terminals RT2, RT4, . . . , of the even-numbered detection electrodes Rx2, Rx4, . . . , the pads P2, P4, . . . , the wiring lines W2, W4, . . . , and the contact holes V2, V4, . . . are located on the other end side of the non-display area NDA. In this layout, a width on one end side and a width on the other end side in the non-display area NDA can be made equal and the frame can be suitably narrows.

As illustrated in the drawing, in the layout in which the pad P3 is closer to the wiring substrate SUB3 than the pad P1, the wiring line W1 is disposed to bypass the inside of the pad P3 (i.e., the side close to the display area DA) and to be arranged on the inside of the wiring line W3 between the pad P3 and the wiring substrate SUB3. The wiring line W2 is disposed to bypass the inside of the pad P4 and to be arranged on the inside of the wiring line W4 between the pad P4 and the wiring substrate SUB3.

FIG. 9 is a diagram showing a basic configuration and an equivalent circuit, of the display panel shown in FIG. 8.

As shown in FIG. 9, the display panel PNL includes a plurality of pixels PX in the display area DA. The pixel indicates a minimum unit which can be controlled independently in accordance with the pixel signal and exists in a region including, for example, switching elements disposed at positions where scanning lines and signal lines to be explained later intersect. The pixels PX are arrayed in a matrix in the first direction X and the second direction Y. In addition, the display panel PNL includes a plurality of scanning lines G (G1 to Gn), a plurality of signal lines S (S1 to Sm), a common electrode CE and the like in the display area DA. The scanning lines G extend in the first direction X and are arranged in the second direction Y. The source lines S extend in the second direction Y and are arranged in the first direction X. The scanning lines G and the signal lines S may not extend linearly but may be bent partially. The common electrode CE is disposed over the pixels PX. The scanning lines G, the signal lines S and the common electrode CE are drawn to the non-display area NDA. In the non-display area NDA, the scanning lines G are connected to a scanning line drive circuit GD, the signal lines S are connected to a signal line drive circuit SD, and the common electrode CE is connected to a common electrode drive circuit CD. The signal line drive circuit SD, the scanning line drive circuit GD, and the common electrode drive circuit CD may be formed on the first substrate SUB1 or several parts or all the parts of the circuits may be built in the IC chip I1 shown in FIG. 8.

Each of the pixels PX comprises a switching element SW, a pixel electrode PE, a common electrode CE, a liquid crystal layer LC and the like. The switching element SW is composed of, for example, a thin-film transistor (TFT) and is electrically connected to the scanning line G and the source line S. More specifically, the switching electrode SW comprises a gate electrode WG, a source electrode WS, and a drain electrode WD. The gate electrode WG is electrically connected with the scanning line G. In the example illustrated, the electrode electrically connected with the signal line S is called the source electrode WS and the electrode electrically connected with the pixel electrode PE is called the drain electrode WD.

The scanning line G is connected with the switching element SW in each of the pixels PX arranged in the first direction X. The signal line S is connected with the switching element SW in each of the pixels PX arranged in the second direction Y. Each of the pixel electrodes PE is opposed to the common electrode CE, and drives the liquid crystal layer LC by an electric field generated between the pixel electrode PE and the common electrode CE. A storage capacitor CS is, for example, formed between the common electrode CE and the pixel electrode PE.

FIG. 10 is a cross-sectional view showing a partial structure of the display panel PNL shown in FIG. 8. In the cross-sectional view, the display device DSP is sectioned in the first direction X.

As shown in FIG. 10, the illustrated display panel PNL has a configuration corresponding to a display mode primarily using a lateral electric field approximately parallel to a surface of the substrate. The display panel PNL may be configured to correspond to a display mode using a longitudinal electric field perpendicular to the surface of the substrate, an electric field inclined to the surface of the substrate or a combination of these electric fields. In the display mode using the lateral electric field, for example, a structure comprising both the pixel electrode PE and the common electrode CE on either of the first substrate SUB1 and the second substrate SUB2 can be applied. In the display mode using the lateral electric field or the inclined electric field, for example, a structure comprising either of the pixel electrode PE and the common electrode CE on the first substrate SUB1 and comprising the other of the pixel electrode PE and the common electrode CE on the second substrate SUB2 can be applied. The surface of the substrate is a surface parallel to the X-Y plane.

The first substrate SUB1 comprises the first basement 10, the signal lines S, the common electrode CE, the metal layer M, pixel electrodes PE, a first insulating layer 11, a second insulating layer 12, a third insulating layer 13, a first alignment film AL1, and the like. The switching elements, scanning lines, and various insulating layers interposed between the elements and lines are not illustrated.

The first insulating layer 11 is located on the first basement 10. The scanning lines and the semiconductor layer of the switching elements (not shown) are located between the first basement 10 and the first insulating layer 11. The signal lines S are located on the first insulating layer 11. The second insulating layer 12 is located on the signal lines S and the first insulating layer 11. The common electrode CE is located on the second insulating layer 12. The metal layer M is in contact with the common electrode CE, directly above the signal lines S. In the example illustrated, the metal layer M is located on the common electrode CE but may be located between the common electrode CE and the second insulating layer 12. The third insulating film 13 is located on the common electrode CE and the metal layer M. The pixel electrodes PE are located on the third insulating layer 13. The pixel electrodes PE are opposed to the common electrode CE via the third insulating layer 13. In addition, each pixel electrode PE includes a slit SL at a position opposed to the common electrode CE. The first alignment film AL1 covers the pixel electrodes PE and the third insulating layer 13.

The scanning lines, the signal lines S, and the metal layer M are formed of metals such as molybdenum, tungsten, titanium and aluminum and may be formed in a single-layer structure or a multi-layer structure. The common electrode CE and the pixel electrodes PE are formed of a transparent conductive material such as ITO or IZO. The first insulating layer 11 and the third insulating layer 13 are inorganic insulating layers while the second insulating layer 12 is an organic insulating layer.

The constitution of the first substrate SUB1 is not limited to the example illustrated but the pixel electrodes PE may be located between the second insulating layer 12 and the third insulating layer 13 and the common electrode CE may be located between the third insulating layer 13 and the first alignment film AL1. In this case, the pixel electrodes PE are shaped in a flat plate including no slits while the common electrode CE includes slits opposed to the pixel electrodes PE. In addition, the pixel electrodes PE and the common electrode CE may be shaped in combs and disposed to be engaged with each other.

The second substrate SUB2 includes a second basement 20, a light-shielding layer BM, a color filter CF, an overcoat layer OC, a second alignment film AL2, and the like.

The light-shielding layer BM and the color filter CF are located on a side of the second basement 20 which is opposed to the first substrate SUB1. The light-shielding layer BM sections the pixels and are located directly above the signal lines S. The color filter CF is opposed to the pixel electrode PE and partially overlaid on the light shielding layer BM. The color filter CF includes a red-colored layer, a green-colored layer and a blue-colored layer. The overcoat layer OC covers the color filter CF. The second alignment film AL2 covers the overcoat layer OC.

The color filter CF may be disposed on the first substrate SUB1. The color filter CF may include color layers of four or more colors. On a white pixel, a white color layer or an uncolored resin material may be disposed or the overcoat layer OC may be disposed without disposing the color layer.

A detection electrode Rx is located on the surface 20B of the second basement 20. The detection electrodes Rx correspond to the second conductive layer L2, may be composed of a conductive layer containing a metal, formed of a transparent conductive material such as ITO or IZO, formed by depositing a transparent conductive layer on a conductive layer containing a metal, or formed of a conductive organic material or a dispersing element of a fine conductive substance, and the like.

A first optical element OD1 including a first polarizer PL1 is located between the first basement 10 and an illumination device BL. A second optical element OD2 including a second polarizer PL2 is located on the detection electrodes Rx. Each of the first optical element OD1 and the second optical element OD2 may include a retardation film as needed.

Next, a configuration example of the sensor SS built in the display device DSP of the present embodiment will be explained. The sensor SS explained below is, for example, a capacitive sensor of a mutual-capacitive type, which detects contact or approach of an object, based on the variation in electrostatic capacitance between a pair of electrodes opposed via a dielectric.

Figure 11:
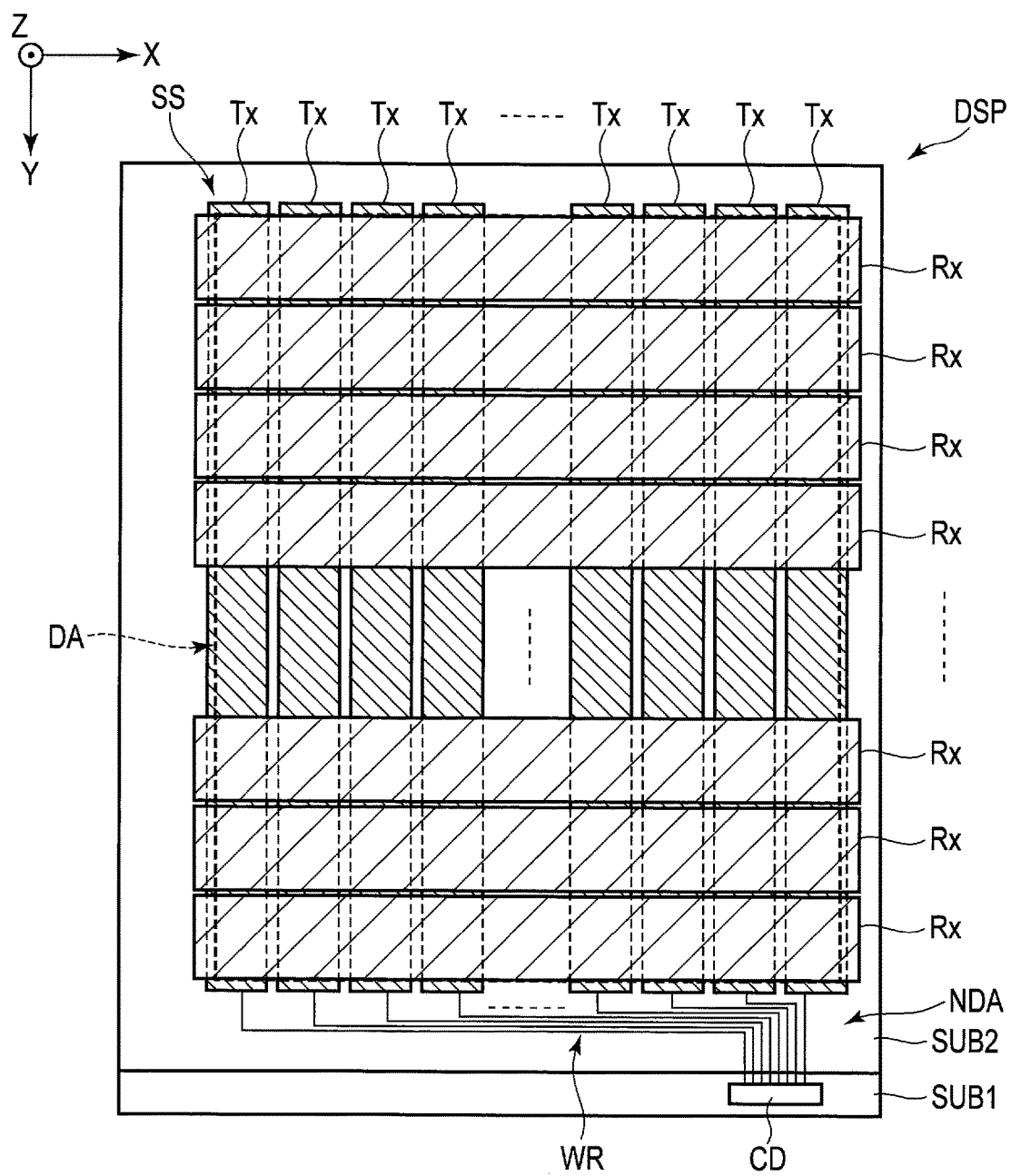
FIG. 11 is a plan view showing a configuration example of the sensor.

FIG. 11 is a plan view showing a configuration example of the sensor SS.

As shown in FIG. 11, the sensor SS comprises sensor drive electrodes Tx and the detection electrodes Rx in the configuration example illustrated. In the example illustrated, the sensor drive electrodes Tx correspond to portions represented by downward sloping hatch lines and are provided on the first substrate SUB1. In addition, the detection electrodes Rx correspond to portions represented by upward sloping hatch lines and are provided on the second substrate SUB2. The sensor drive electrodes Tx and the detection electrodes Rx intersect each other in the X-Y plane. The detection electrodes Rx are opposed to the sensor drive electrodes Tx in the third direction Z.

The sensor drive electrodes Tx and the detection electrodes Rx are located in the display area DA and several parts of the electrodes extend to the non-display area NDA. In the example illustrated, the sensor drive electrodes Tx are formed in a strip shape extending in the second direction Y and arranged so as to be spaced apart from each other in the first direction X. The detection electrodes Rx extend in the first direction X and are arranged so as to be spaced apart in the second direction Y. The detection electrodes Rx are connected to the pads provided on the first substrate SUB1 and electrically connected to the detection circuit RC via the wiring lines as explained with reference to FIG. 8. Each of the sensor drive electrodes Tx is electrically connected with the common electrode drive circuit CD via a wiring line WR. The number, size and shape of the sensor drive electrodes Tx and the detection electrodes Rx are not particularly limited but can be variously changed.

The sensor drive electrode Tx includes the common electrode CE, has a function of urging an electric field to be generated between the own electrode and the pixel electrode PE and a function of detecting the position of the object by generating the capacitance between the own electrode and the detection electrode Rx.

The common electrode driving circuit CD supplies the common drive signals to the sensor drive electrodes Tx including the common electrodes CE at the display driving time to display images in the display area DA. In addition, the common electrode drive circuit CD supplies the sensor drive signals to the sensor drive electrodes Tx at the sensing driving time to execute sensing. The detection electrodes Rx output sensor signals necessary for sensing (i.e., signals based on variation in inter-electrode capacitance between the sensor drive electrodes Tx and the detection electrodes Rx) in accordance with supply of the sensor drive signals to the sensor drive electrodes Tx. The detection signals output from the detection electrodes Rx are input to the detection circuit RC shown in FIG. 8.

The sensor SS in each of the above-explained configuration examples is not limited to the sensor of the mutual-capacitive type which detects the object based the variation in electrostatic capacitance between a pair of electrodes (in the above case, the electrostatic capacitance between the sensor drive electrodes Tx and the detection electrodes Rx). The sensor SS may be a self-capacitive type which detects the object based the variation in electrostatic capacitance of the detection electrodes Rx.

FIG. 12 is a plan view showing another configuration example of the display device DSP of the embodiments. The configuration example shown in FIG. 12 is different from the configuration example shown in FIG. 8 with respect to a feature that the detection electrodes Rx1, Rx2, Rx3, . . . extend in the second direction Y, and are arranged in the first direction X and spaced apart from each other. In the example illustrated, the detectors RS extend in the second direction Y in the display area DA. In addition, the terminals RT1, RT2, RT3, . . . are arranged between the display area DA and the wiring substrate SUB3 in the first direction X and spaced apart from each other. The contact holes V1, V2, V3, . . . are arranged and spaced apart in the first direction X. The display device DSP may comprise sensor drive electrodes extending in the first direction X so as to be arranged in the second direction Y and spaced apart from each other, which are not illustrated.

The configuration example shown in FIG. 12 is applicable to the self-capacitive sensor SS using the detection electrodes Rx and is also applicable to the mutual-capacitive sensor SS using the detection electrodes Rx and sensor drive electrodes (not shown).

FIG. 13 is an illustration showing a configuration example of the detector RS in the detection electrode Rx1 shown in FIG. 8 and FIG. 12.

In the example shown in FIG. 13(A), the detector RS is formed of mesh-shaped metal wires MS. The metal wires MS are joined to the terminal RT1. In the example shown in FIG. 13(B), the detector RS is formed of wave-shaped metal wires MW. In the example illustrated, the metal wires MW are formed in a sawtooth shape but may be in the other shape such as a sine wave shape. The metal wires MW are joined to the terminal RT1.

The terminal RT1 is formed of for example, the same material as the detector RS. The circular contact hole V1 is formed in the terminal RT1.

FIG. 14 is a cross-sectional view showing the display panel PNL including the contact hole V1 shown in FIG. 8 as sectioned in line XIV-XIV. Main portions alone necessary for explanations are illustrated in the drawing.

As shown in FIG. 14, the first substrate SUB1 includes the first basement 10, the pad P1 corresponding to the first conductive layer L1, the second insulating layer 12 corresponding to the organic insulating layer, and the like. The first conductive layer L1 is formed of, for example, the same material as the signal lines S shown in FIG. 10. The first insulating layer 11 shown in FIG. 10, the other insulating layer or the other conductive layer may be disposed between the first basement 10 and the pad P1 and between the first basement 10 and the second insulating layer 12.

The second substrate SUB2 includes the second basement 20, the detection electrode Rx1 corresponding to the second conductive layer L2, the light-shielding layer BM and the overcoat layer OC corresponding to the organic insulating layers, and the like.

The sealing material SE corresponds to the organic insulating layer and is located between the second insulating layer 12 and the overcoat layer OC. The liquid crystal layer LC is located in the gap between the first substrate SUB1 and the second substrate SUB2. The metal layer M, the third insulating layer 13, and the first alignment film LA1 shown in FIG. 10 may be interposed between the second insulating layer 12 and the sealing material SE, which is not illustrated in the figure. Alternatively, the second alignment film AL2 shown in FIG. 10 may be interposed between the overcoat layer OC and the sealing material SE.

The contact hole V1 includes the hole VA which penetrates the second basement 20 and the terminal RT of the detection electrode Rx, the hole VB which penetrates the pad P1, the hole VC which penetrates various organic insulating layers, and the concavity CC formed in the first basement 10. The hole VC includes a first part VC1 which penetrates the second insulating layer 12, a second part VC2 which penetrates the sealing material SE, and a third part VC3 which penetrates the light-shielding layer BM and the overcoat layer OC. The connecting material C is provided on the contact hole V1 to electrically connect the pad P1 with the detection electrode Rx.

The second insulating layer 12 is located between the pad P1 and the second basement 20 and is in contact with the upper surface LT1 of the pad P1. The connecting material C is in contact with the upper surface LT1 of the pad P1 and the inner surface LS1 of the pad P1 in the hole VB.

According to the display device DSP comprising the above-explained sensor SS, the detection electrode Rx provided on the second substrate SUB2 is connected with the pad P provided on the first substrate SUB1 by the connecting material C provided in the contact hole V (V1, V2, V3, . . . ). For this reason, the wiring substrate to connect the detection electrode Rx (Rx1, Rx2, Rx3, . . . ) with the detection circuit RC does not need to be mounted on the second substrate SUB2. In other words, the third substrate SUB3 mounted on the first substrate SUB1 forms a transmission path to transmit a signal necessary to display an image on the display panel PNL and a transmission path to transmit a signal between the detection electrode Rx and the detection circuit RC. Therefore, the number of wiring substrates can be reduced and the costs can be reduced as compared with the configuration examples which require the wiring substrates other than the wiring substrate SUB3. In addition, the non-display area of the display panel PNL, particularly, the width of the edge on which the wiring substrate SUB3 is mounted can be reduced since space to connect the wiring substrate with the second substrate SUB2 is unnecessary. The display device can be thereby designed in a narrower frame shape and its manufacturing costs can be reduced.

Figure 15:
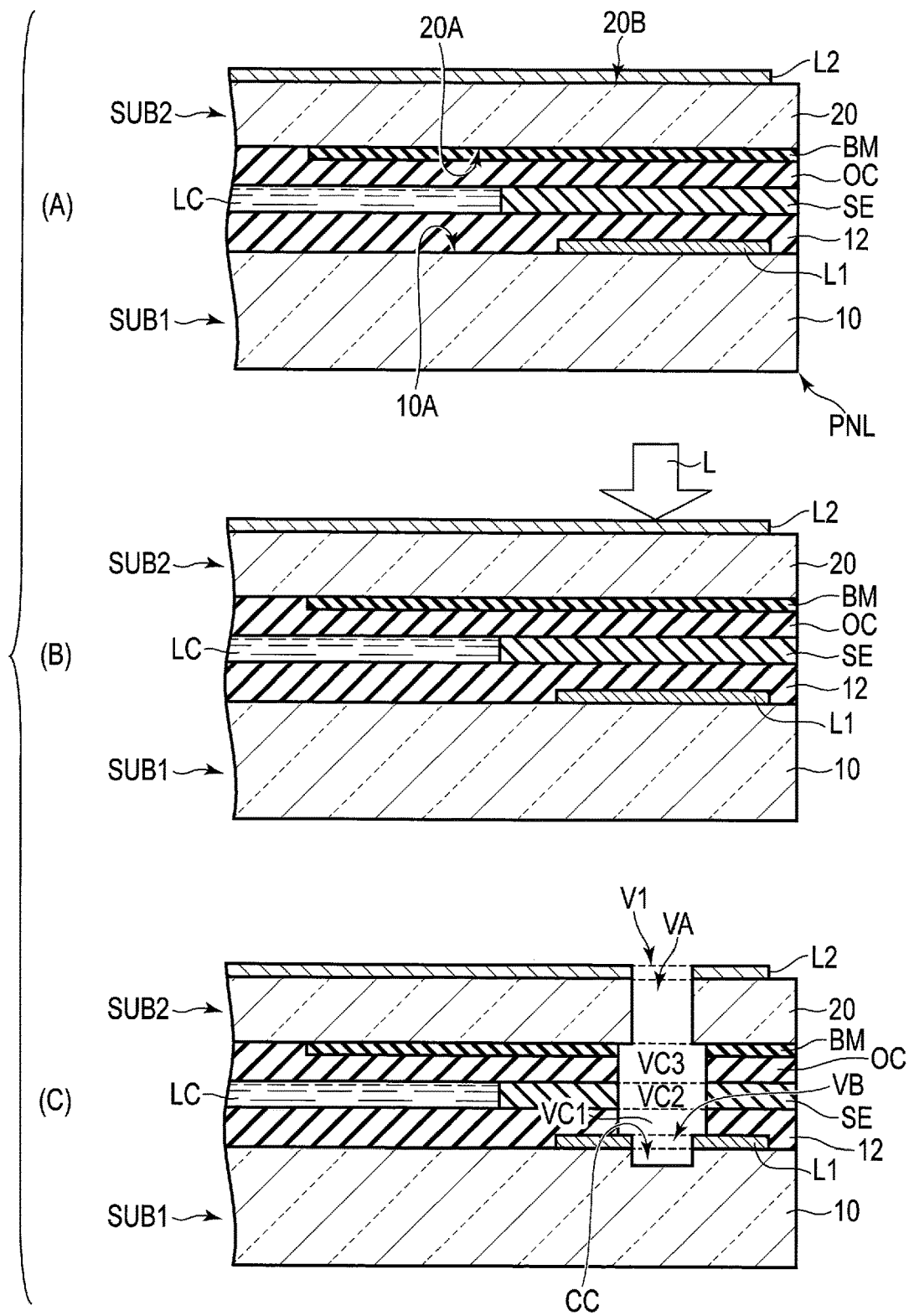
FIG. 15 is a cross-sectional view for explanation of a method of manufacturing the display device of the embodiment.

Next, an example of a method of manufacturing the above-explained display device DSP will be explained with reference to FIG. 15 to FIG. 17.

First, as shown in FIG. 15(A), the display PNL is prepared. The illustrated display panel PNL comprises the first substrate SUB1 including at least the first basement 10 and the first conductive layer L1, and the second substrate SUB2 including at least the second basement 20 and the second conductive layer L2. In the display panel PNL, the first substrate SUB1 is adhered to the second SUB2 by the sealing material SE in a state in which the second basement 20 is opposed to the first conductive layer L1 and the second basement 20 is separated from the first conductive layer L1. The first conductive layer L1 corresponds to, for example, the pad P1 shown in FIG. 14 or the like and the second conductive layer L2 corresponds to, for example, the detection electrode Rx1 shown in FIG. 14 or the like.

An example of manufacturing the display panel PNL will be explained. The first substrate SUB1 in which the first conductive layer L1, the second insulating layer 12, and the like are formed on the surface 10A of the first basement 10 is prepared. In contrast, the second substrate SUB2 in which the light-shielding layer BM, the overcoat layer OC, and the like are formed on the surface 20A of the second basement 20 is prepared. At this time, the second conductive layer is not formed on the surface 20B of the second basement 20. The sealing material SE is formed on either of the first substrate SUB1 and the second substrate SUB2 along the edge side of the substrate and the liquid crystal material is dropped into the inner side of the sealing material SE. After that, the first substrate SUB1 is stuck to the second substrate SUB2, the sealing material SE is cured, and the first substrate SUB1 is adhered to the second substrate SUB2. After that, the first basement 10 and the second basement 20 are etched in an etching solution such as hydrofluoric acid (HF), and the first basement 10 and the second basement 20 are thinned. After that, the second conductive layer L2 is formed on the surface 20B of the second basement 20. The display panel PNL shown in FIG. 15(A) is thereby manufactured.

Another example of manufacturing the display panel PNL will be explained. In other words, the light-shielding layer BM, the overcoat layer OC and the like are formed on the surface 20A of the second basement 20 and the second substrate SUB2 including the second conductive layer L2 formed on the surface 20B of the second basement 20 is prepared while the first substrate SUB1 is prepared similarly to the above-explained examples. After that, the sealing material SE is formed, the liquid crystal material is dropped, and the first substrate SUB1 is adhered to the second substrate SUB2. The display panel PNL shown in FIG. 15(A) is thereby manufactured.

Next, as shown in FIG. 15(B), laser light L is applied to the second substrate SUB2. In the example illustrated, the laser light L is applied from the upper side of the second conductive layer L2. As the laser light source, for example, a carbon dioxide laser device or the like can be employed, but a device capable of forming holes in a glass material and an organic material may be usable and an excimer laser device and the like can also be employed.

The hole VA which penetrates the second basement 20 and the second conductive layer L2 is formed as shown in FIG. 15(C) by applying the laser light L. In addition, in the example illustrated, when the laser light L is applied, the third part VC3 of the hole which penetrates the light-shielding layer BM and the overcoat layer OC located directly under the hole VA, the second part VC2 of the hole which penetrates the sealing material SE located directly under the third part VC3, the second part VC1 which penetrates the second insulating layer 12 located directly under the second part VC2, the hole VB which penetrates the first conductive layer L1 located directly under the first part VC1, and the concavity CC of the first basement 10 located directly under the hole VB are also formed simultaneously. The contact hole V1 for connection between the first conductive layer L1 and the second conductive layer L2 is thereby formed.

If thermal energy is given to the display panel PNL by the application of the laser light L, the organic insulating material used for the second insulating layer 12 sublimes more easily than the metal used for the pad P1. For this reason, the hole VC is formed to expand farther than the holes VA and VB as explained above. The contact hole V1 removes a part of the second insulating layer 12 and exposes the first conductive layer L1.

Next, as shown in FIG. 16, the connecting material C is formed to electrically connect the first conductive layer L1 with the second conductive layer L2.

More specifically, as shown in FIG. 16(A), first, the display panel PNL is installed in a chamber CB, air in the chamber CB is discharged and the connecting material C is injected into the hole VA in a vacuum (i.e., in an environment of an atmosphere lower than a barometric pressure). At this time, the connecting material C often does not flow to the first conductive layer L1 and space SP is formed between the connecting material C and the first conductive layer L1. However, the space SP is vacuum.

Then, as shown in FIG. 16(B), the degree of vacuum is lowered by introducing air, an inert gas and the like into the chamber CB, the connecting material C is urged to flow from the hole VA into the holes VC and VB and the concavity CC by a barometric difference between the space SP and the surrounding of the display panel PNL. The connecting material C contacts the first conductive layer L1. Even if the contact hole V1 is filled with the conductive material used for the connecting material C, the conductive material is blocked by the organic insulating layer such as the sealing material SE.

Then, as shown in FIG. 16(C), the volume of the connecting material C is reduced and a hollow HL is formed by removing the solvent contained in the connecting material C. The connecting material C thus formed is in contact with each of the second conductive layer L2 and the second basement 20 in the hole VA, each of the light-shielding layer BM, the overcoat layer OC, the sealing material SE, and the second insulating layer 12 in the hole VC, the first conductive layer L1 in the hole VB, and the first basement 10 in the concavity CC.

The method of forming the connecting material C explained with reference to FIG. 16 is a mere example and is not limited. For example, the same connecting material C as that explained above can be formed even by a method of injecting the connecting material C into the hole VA under a barometric pressure and removing the solvent contained in the connecting material C.

Next, as shown in FIG. 17(A), the protection material PF is formed. In the example illustrated, the protection material PF injected into the hollow HL of the connecting material C and covers the second conductive layer L2 and the connecting material C. A surface SUB2A of the second substrate SUB2 is thereby approximately planarized and the difference in height from the portion overlaid on the contact hole V1 can be reduced.

Next, as shown in FIG. 17(B), the second optical element OD2 is adhered to the protection material PF. In the example illustrated, the second optical element OD2 extends to the portion overlaid on the contact hole V1. Since the difference in height resulting from the contact hole V1 is reduced by the protection material PF, peeling the second optical element OD2 due to the difference in height of the base of the second optical element OD2 can be suppressed when the second optical element OD2 is adhered.

As described above, according to the embodiments, a display device and its manufacturing method capable of thinning the frame and reducing the costs can be obtained. Alternatively, a display device having a high product yield can be obtained. Alternatively, a display device having a high manufacturing yield can be obtained.

Modified Example 1

Figure 18A:
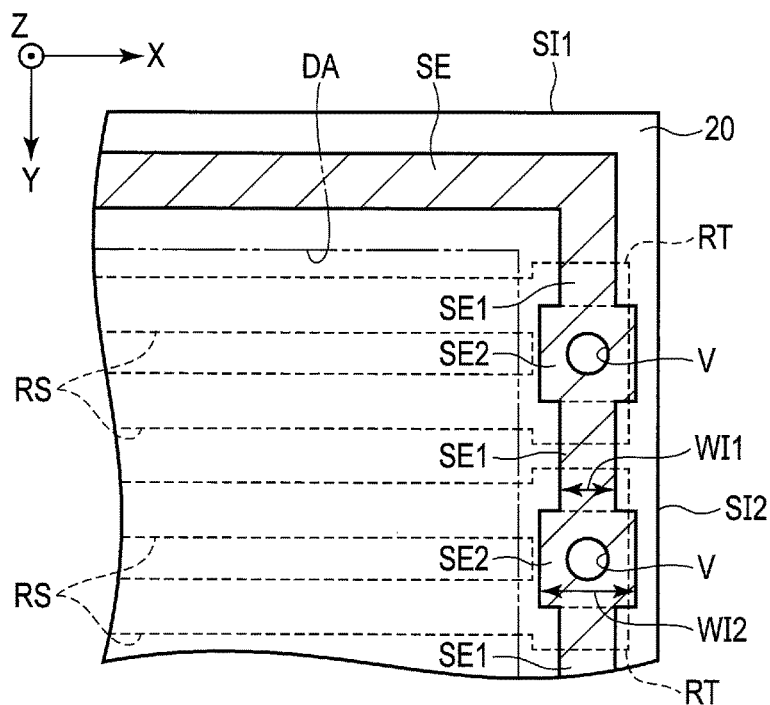
FIG. 18A is a plan view showing a configuration example of a part of the display device according to modified example 1 of the embodiment.

Next, the display device DSP according to modified example 1 of the embodiment will be explained. FIG. 18A is a plan view showing a configuration example of several parts of the display device DSP according to modified example 1 of the embodiment.

As shown in FIG. 18A, the illustrated configuration example is different from the above-explained configuration example with reference to a feature that the width of the sealing material SE is not uniform. In the figure, hatch lines are drawn on the sealing material SE. The sealing material SE includes a sealing part SE1 having a first width WI1 and a second sealing part SE2 having a second width WI2 greater than the first width WI1. The second width WI2 of the sealing material SE on which the contact holes V are disposed is greater than the first width WI1 of the sealing material SE on which the contact holes V are not disposed (WI2>WI1).

The first sealing part SE1 and the second sealing part SE2 extend in the same direction. In modified example 1, the first sealing part SE1 and the second sealing part SE2 extend in the second direction Y. The second basement 20 has a plurality of sides SI1 and SI2. The side SI1 is parallel to the first direction X and the side SI2 is parallel to the second direction Y. In modified example 1, the first sealing part SE1 and the second sealing part SE2 are opposed to the side SI2 of the second basement 20 and extend parallel to the side SI2. A first width WI1 is a length of the first sealing part SE1 in the first direction X and a second width WI2 is a length of the second sealing part SE2 in the first direction X.

The contact hole V penetrates the second sealing part SE2 of the sealing material SE. In modified example 1, one contact hole V is located in the region opposed to each of the terminals RT but a plurality of contact holes V may be located. In addition, in modified example 1, one contact hole V is located in the region opposed to each of the second sealing part SE2 but a plurality of contact holes V may be located.

A width of the parts other than the first sealing part SE1 and the second sealing part SE2, of four sides of the sealing material SE, is not particularly limited. For example, the parts other than the second sealing part SE2, of the sealing material SE, may have the width WI1.

In the display device DSP according to modified example 1, the sealing material SE includes the second sealing part SE2. The second width WI2 is greater than the first width WI1. For this reason, even if the volume of the second sealing part SE2 is reduced in accordance with the contact hole V, reduction in the adhesive strength between the second sealing part SE2 and the first substrate SUB1 and the adhesive strength between the second sealing part SE2 and the second substrate SUB2 can be suppressed. For this reason, the display panel PNL can be obtained. Alternatively, the high-reliability display panel PNL can be obtained.

Figure 18B:
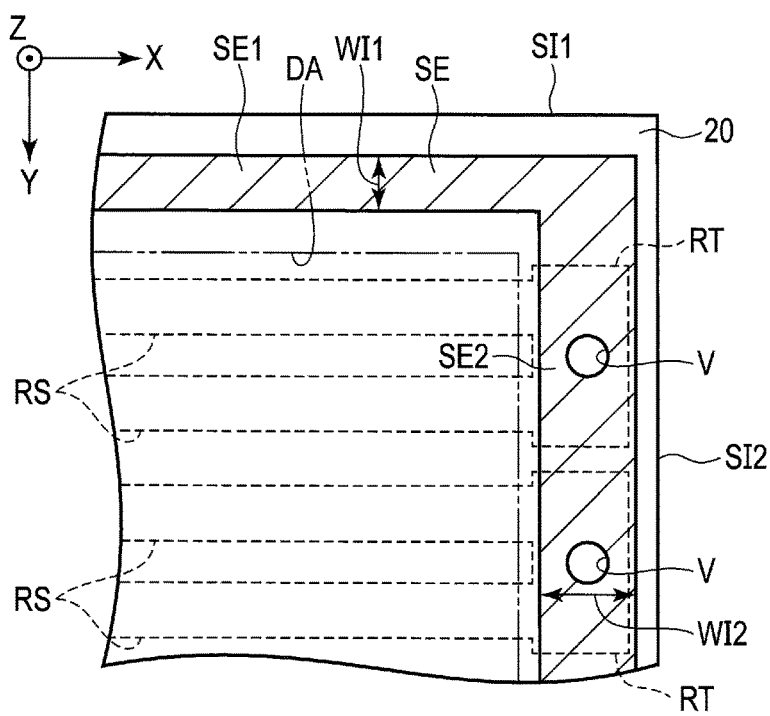
FIG. 18B is a plan view showing another configuration example of a part of the display device according to modified example 1 of the embodiment.

As shown in FIG. 18B, unlike the example shown in FIG. 18A, the second width WI2 of the sealing material SE on the side SI2 on which the contact holes V are disposed may be greater than the first width WI1 of the sealing material SE on the side SI1 on which the contact holes V are not disposed. In the example shown in FIG. 18B, the first sealing part SE1 is provided on the side SI1 on which the contact hole V is not disposed, and the second sealing part SE2 is provided on the side SI2 on which the contact hole V is disposed. The first sealing part SE1 is located oppositely to the side SI1 of the second basement 20 and extends parallel to the side SI1. The second sealing part SE2 is located oppositely to the side SI2 of the second basement 20 and extends parallel to the side SI2.

Modified Example 2

Next, the display device DSP according to modified example 2 of the embodiments will be explained. FIG. 19 is a plan view showing a configuration example of several parts of the display device DSP according to modified example 2 of the embodiment.

As shown in FIG. 19, the illustrated configuration example is different from the above-explained configuration examples with reference to a feature that the contact holes V are not arranged in a straight line. In the figure, hatch lines are drawn on the sealing material SE. The contact holes V1 to V6 penetrate the second basement 20 and the sealing material SE and are arranged in the direction in which the terminals RT are arranged. In the embodiments, the contact holes V1 to V6 are arranged along the side SI1 closer to the wiring substrate SUB3, of the sides of the second basement 20. In modified example 2, the side SI1 is not the long side but the short side of the second basement 20. Positions of the terminals RT1 to RT6 are aligned in the direction along the side SI1. In the present example, the positions of the terminals RT1 to RT6 are aligned in the first direction X.

The connecting material C electrically connects the first conductive layer L1 (pad P) with the second conductive layer L2 (terminal RT) via at least one contact hole V of the contact holes V1 to V6, which is not illustrated in the figure. In modified example 2, since one contact hole V is overlaid on each of the terminals RT, the connecting material C electrically connects the first conductive layer L1 (pad P) with the second conductive layer L2 (terminal RT) via one contact hole V. Unlike the embodiments, the contact holes V may be overlaid on one terminal RT.

The positions of the contact holes V1 to V6 are not arranged in the direction (first direction X) in which the terminals RT (second conductive layers) are arranged. The contact holes V1 to V6 are arranged in a staggered shape. Each of a distance from the side SI1 to the contact hole V1, a distance from the side SI1 to the contact hole V3 and a distance from the side SI1 to the contact hole V5, in the second direction Y, is referred to as a distance DI1. Each of a distance from the side SI1 to the contact hole V2, a distance from the side SI1 to the contact hole V4 and a distance from the side SI1 to the contact hole V6, in the second direction Y, is referred to as a distance DI2. The distance DI1 is different from the distance DI2 (DI1≠DI2).

The contact holes V do not need to be arranged in the direction in which the sealing material SE extends and may not be arranged in a staggered shape.

In the display device DSP according to modified example 2 as explained above, the contact holes V are not arranged in the direction in which the terminals RT are arranged. Even if a pitch of the contact holes V in the first direction X in modified example 2 is equal to a pitch of the contact holes V in the first direction X in a case where the contact holes V are arranged in the first direction X, a linear dimension between the contact holes V can be made greater in modified example 2.

Margin can be thereby obtained at accuracy in positions of the contact holes V. Alternatively, a pitch of the contact holes V in the direction in which the sealing material SE extends can be made smaller. The above-explained configuration can also be employed when the contact holes V are arranged along the side SI2 which is the longer side of the second basement 20. In this case, the sealing material SE extends along the side SI2, of the sides on which the contact holes V are arranged. However, if the contact holes V are arranged along the side SI1 which is the shorter side, the configuration is preferable with respect to a feature that the margin can be obtained at accuracy in positions of the contact holes V.

Modified Example 3

Next, the display device DSP according to modified example 3 of the embodiment will be explained. FIG. 20 is a plan view showing a configuration example of several parts of the display device DSP according to modified example 3 of the embodiment.

As shown in FIG. 20, the illustrated configuration example is different from the above-explained configuration example with reference to a feature that a notch N is formed on the second basement 20 instead of the hole VA. In the figure, hatch lines are drawn on the sealing material SE. The notch N is formed on the side SI1 (edge) of the second basement 20.

As shown in FIG. 21, the contact hole V includes the holes VB and VC the concavity CC. The notch N is opposed to the contact hole V (holes VB and VC). The sealing material SE is not partially covered with the second substrate SUB2. The connecting material C electrically connects the first conductive layer L1 with the second conductive layer L2 via the holes VB and VC and the notch N.

The hollow of the connecting material C is filled with the filling material FI and at least several parts of the connecting material C and the sealing material SE are covered with the filling material FI. The filling material FI is formed of for example, an organic insulating material. The filling material FI may be provided as needed. By providing the filling material FI, the filling material FI can protect the connecting material C and the like.

As shown in FIG. 22, when the notch N is formed, laser light is applied to the display panel PNL and the contact hole V including the holes VA, VB and VC is formed. After that, the second substrate SUB2 (second basement 20) is sectioned along a scribe line e passing through the contact holes V. An edge portion A1 of the second substrate SUB2 can be thereby removed and the notch N is formed. After the notch N is formed, the connecting material C which connects the first conductive layer L1 with the second conductive layer L2 via the notch N is formed.

The scribe line e needs only to pass through the contact holes V. At this time, however, the scribe line e desirably passes at a position closer to the outer peripheral side of the second basement 20 than the centers of the contact holes V.

In the display device DSP according to modified example 3 as explained above, the edge portion A1 of the second substrate SUB2 is removed. Reduction in the strength of the second basement 20 can be suppressed and the stress which can be applied to the second basement 20 can be reduced.

The configuration according to modified example 3 can also be employed to the configuration in which the contact holes V are not arranged in one direction as shown in FIG. 19.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the hole VC is expanded as compared with each of the holes VA and VB in the above-explained embodiments and the modified examples. However, the diameter of the hole VC may be equal to or smaller than the diameter of each of the holes VA and VB in the X-Y plane if the connecting material C and the first conductive layer L1 become sufficiently conductive.

Inventions according to the above-explained embodiments and modified examples will be additionally described below.

(1) An electronic device, comprising:
a first substrate including a first basement and a first conductive layer;
a second substrate including a second basement opposed to the first basement and the first conductive layer, and a second conductive layer;
a sealing material located between the first substrate and the second substrate to bond the first substrate to the second substrate;
a contact hole penetrating the second basement, the sealing material and the first conductive layer; and
a connecting material electrically connecting the first conductive layer with the second conductive layer via the contact hole.

(2) The electronic device according to (1), wherein the sealing material includes a first sealing part having a first width and a second sealing part having a second width larger than the first width, and
the contact hole penetrates the second sealing part of the sealing material.

(3) The electronic device according to (2), wherein the first sealing part and the second sealing part extend in a same direction.

(4) The electronic device according to (2), wherein the second basement has a plurality of sides, and
the first sealing part and the second sealing part extend parallel to one of the sides of the second basement.

(5) The electronic device according to (2), wherein the second basement has a plurality of sides,
the first sealing part is located opposite to one of the sides of the second basement, and
the second sealing part is located opposite to another side of the second basement.

(6) The electronic device according to (1), wherein the second conductive layer includes a detector located in a first area, and a terminal located in a second area adjacent to the first area and connected to the detector, and
the connecting material is electrically connected to the terminal in the second area.

(7) The electronic device according to (6), further comprising:
a detection circuit electrically connected with the first conductive layer to read a sensor signal output from the second conductive layer.

(8) The electronic device according to (6), wherein the first substrate includes a sensor driving electrode which intersects the detector.

(9) The electronic device according to (1), wherein
the first substrate further includes a first insulating layer located between the first basement and the first conductive layer, a second insulating layer disposed on the first insulating layer and the first conductive layer, and a third insulating layer disposed on the second insulating layer,
the contact hole further penetrates the second insulating layer,
the first insulating layer and the third insulating layer are inorganic insulating layers, and
the second insulating layer is an organic insulating layer.

(10) An electronic device, comprising:
a first substrate including a first basement and a first conductive layer;
a second substrate including a second basement opposed to the first basement and the first conductive layer, and a plurality of second conductive layers;
a sealing material located between the first substrate and the second substrate to bond the first substrate to the second substrate;
a plurality of contact holes penetrating the second basement and the sealing material; and
a connecting material electrically connecting the first conductive layer with the second conductive layer via at least one of the contact holes,
wherein
positions of the contact holes are not aligned in a direction in which the second conductive layers are arranged.

(11) The electronic device according to (10), wherein the contact holes are arranged in a staggered state.

(12) The electronic device according to (10), wherein
the second conductive layer includes a detector located in a first area, and a terminal located in a second area adjacent to the first area and connected to the detector, and
the connecting material is electrically connected to the terminal in the second area.

(13) The electronic device according to (12), further comprising:
a detection circuit electrically connected with the first conductive layer to read a sensor signal output from the second conductive layer.

(14) The electronic device according to (12), wherein the first substrate includes a sensor driving electrode which intersects the detector.

(15) The electronic device according to (10), wherein
the first substrate further includes a first insulating layer located between the first basement and the first conductive layer, a second insulating layer disposed on the first insulating layer and the first conductive layer, and a third insulating layer disposed on the second insulating layer,
the contact hole further penetrates the second insulating layer,
the first insulating layer and the third insulating layer are inorganic insulating layers, and
the second insulating layer is an organic insulating layer.

(16) An electronic device, comprising:
a first substrate including a first basement and a first conductive layer;
a second substrate including a second basement opposed to the first basement and the first conductive layer, and a second conductive layer;
a sealing material located between the first substrate and the second substrate to bond the first substrate to the second substrate;
a second hole penetrating the first conductive layer;
a third hole connected to the second hole to penetrate the sealing material;
a notch opposed to the second hole and the third hole and formed on one of edges of the second basement; and
a connecting material electrically connecting the first conductive layer with the second conductive layer via the second hole, the third hole, and the notch.

(17) The electronic device according to (16), wherein
the second conductive layer includes a detector located in a first area, and a terminal located in a second area adjacent to the first area and connected to the detector, and
the connecting material is electrically connected to the terminal in the second area.

(18) The electronic device according to (17), further comprising:
a detection circuit electrically connected with the first conductive layer to read a sensor signal output from the second conductive layer.

(19) The electronic device according to (17), wherein the first substrate includes a sensor driving electrode which intersects the detector.

(20) The electronic device according to (16), wherein
the first substrate further includes a first insulating layer located between the first basement and the first conductive layer, a second insulating layer disposed on the first insulating layer and the first conductive layer, and a third insulating layer disposed on the second insulating layer,
the contact hole further penetrates the second insulating layer,
the first insulating layer and the third insulating layer are inorganic insulating layers, and
the second insulating layer is an organic insulating layer.

What is claimed is:
1. An electronic device, comprising:
a first substrate including a first basement and a first conductive layer;
a second substrate including a second basement opposed to the first basement and the first conductive layer, and a second conductive layer;
a sealing material located between the first substrate and the second substrate to bond the first substrate to the second substrate;
a contact hole penetrating the second basement, the sealing material and the first conductive layer; and
a connecting material electrically connecting the first conductive layer with the second conductive layer via the contact hole,
wherein the sealing material includes a first sealing part having a first width and a second sealing part having a second width larger than the first width, and
wherein the contact hole penetrates the second sealing part of the sealing material.

2. The electronic device according to claim 1, wherein the first sealing part and the second sealing part extend in a same direction.

3. The electronic device according to claim 1, wherein
the second basement has a plurality of sides, and
the first sealing part and the second sealing part extend parallel to one of the sides of the second basement.

4. The electronic device according to claim 1, wherein
the second basement has a plurality of sides,
the first sealing part is located opposite to one of the sides of the second basement, and
the second sealing part is located opposite to another side of the second basement.

5. The electronic device according to claim 1, wherein
the second conductive layer includes a detector located in a first area, and a terminal located in a second area adjacent to the first area and connected to the detector, and
the connecting material is electrically connected to the terminal in the second area.

6. The electronic device according to claim 5, further comprising:
a detection circuit electrically connected with the first conductive layer to read a sensor signal output from the second conductive layer.

7. The electronic device according to claim 5, wherein
the first substrate includes a sensor driving electrode which intersects the detector.

8. The electronic device according to claim 1, wherein
the first substrate further includes a first insulating layer located between the first basement and the first conductive layer, a second insulating layer disposed on the first insulating layer and the first conductive layer, and a third insulating layer disposed on the second insulating layer,
the contact hole further penetrates the second insulating layer,
the first insulating layer and the third insulating layer are inorganic insulating layers, and
the second insulating layer is an organic insulating layer.

9. An electronic device, comprising:
a first substrate including a first basement and a first conductive layer;
a second substrate including a second basement opposed to the first basement and the first conductive layer, and a plurality of second conductive layers;
a sealing material located between the first substrate and the second substrate to bond the first substrate to the second substrate;
a plurality of contact holes penetrating the second basement and the sealing material; and
a connecting material electrically connecting the first conductive layer with the second conductive layer via at least one of the contact holes,
wherein positions of the contact holes are not aligned in a direction in which the second conductive layers are arranged,
wherein the second conductive layer includes a detector located in a first area, and a terminal located in a second area adjacent to the first area and connected to the detector, and
wherein the connecting material is electrically connected to the terminal in the second area.

10. The electronic device according to claim 9, wherein
the contact holes are arranged in a staggered state.

11. The electronic device according to claim 9, further comprising:
a detection circuit electrically connected with the first conductive layer to read a sensor signal output from the second conductive layer.

12. The electronic device according to claim 9, wherein
the first substrate includes a sensor driving electrode which intersects the detector.

13. The electronic device according to claim 9, wherein
the first substrate further includes a first insulating layer located between the first basement and the first conductive layer, a second insulating layer disposed on the first insulating layer and the first conductive layer, and a third insulating layer disposed on the second insulating layer,
the contact hole further penetrates the second insulating layer,
the first insulating layer and the third insulating layer are inorganic insulating layers, and
the second insulating layer is an organic insulating layer.

14. An electronic device, comprising:
a first substrate including a first basement and a first conductive layer;
a second substrate including a second basement opposed to the first basement and the first conductive layer, and a second conductive layer;
a sealing material located between the first substrate and the second substrate to bond the first substrate to the second substrate;
a first hole penetrating the first conductive layer;
a second hole connected to the first hole to penetrate the sealing material;
a notch opposed to the first hole and the second hole and formed on one of edges of the second basement; and
a connecting material electrically connecting the first conductive layer with the second conductive layer via the first hole, the second hole, and the notch.

15. The electronic device according to claim 14, wherein
the second conductive layer includes a detector located in a first area, and a terminal located in a second area adjacent to the first area and connected to the detector, and
the connecting material is electrically connected to the terminal in the second area.

16. The electronic device according to claim 15, further comprising:
a detection circuit electrically connected with the first conductive layer to read a sensor signal output from the second conductive layer.

17. The electronic device according to claim 15, wherein
the first substrate includes a sensor driving electrode which intersects the detector.

18. The electronic device according to claim 14, wherein
the first substrate further includes a first insulating layer located between the first basement and the first conductive layer, a second insulating layer disposed on the first insulating layer and the first conductive layer, and a third insulating layer disposed on the second insulating layer,
the second hole further penetrates the second insulating layer,
the first insulating layer and the third insulating layer are inorganic insulating layers, and
the second insulating layer is an organic insulating layer.

* * * * *